US012603114B2

(12) United States Patent
Sugimoto

(10) Patent No.: US 12,603,114 B2
(45) Date of Patent: Apr. 14, 2026

(54) MEMORY DEVICE

(71) Applicant: Kioxia Corporation, Tokyo (JP)

(72) Inventor: Takeshi Sugimoto, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 137 days.

(21) Appl. No.: 18/589,351

(22) Filed: Feb. 27, 2024

(65) Prior Publication Data

US 2024/0321323 A1 Sep. 26, 2024

(30) Foreign Application Priority Data

Mar. 23, 2023 (JP) ................................. 2023-046814

(51) Int. Cl.
| | |
|---|---|
| *G11C 5/06* | (2006.01) |
| *G11C 5/10* | (2006.01) |
| *G11C 11/4076* | (2006.01) |
| *G11C 11/4091* | (2006.01) |
| *G11C 11/4096* | (2006.01) |

(52) U.S. Cl.
CPC ............ *G11C 5/10* (2013.01); *G11C 11/4076* (2013.01); *G11C 11/4091* (2013.01); *G11C 11/4096* (2013.01)

(58) Field of Classification Search
CPC ... G11C 5/10; G11C 11/4076; G11C 11/4091; G11C 11/4096
See application file for complete search history.

(56) References Cited

U.S. PATENT DOCUMENTS

| | | | |
|---|---|---|---|
| 10,607,995 B2 | 3/2020 | Roberts et al. | |
| 10,672,456 B2 | 6/2020 | Fishburn et al. | |
| 10,825,815 B2 | 11/2020 | Tang et al. | |
| 10,910,378 B2 | 2/2021 | Lee et al. | |
| 11,195,836 B2 | 12/2021 | Kim et al. | |
| 11,222,690 B2 | 1/2022 | Karda et al. | |
| 11,227,864 B1 | 1/2022 | Saeedi Vahdat et al. | |
| 2011/0228612 A1* | 9/2011 | Hama | G11C 29/48 365/201 |
| 2020/0083225 A1 | 3/2020 | Ma et al. | |
| 2020/0212041 A1 | 7/2020 | Machkaoutsan et al. | |
| 2020/0227416 A1 | 7/2020 | Lilak et al. | |

(Continued)

FOREIGN PATENT DOCUMENTS

| | | |
|---|---|---|
| JP | 2022-147872 A | 10/2022 |
| TW | 202301620 A | 1/2023 |

*Primary Examiner* — Min Huang
(74) *Attorney, Agent, or Firm* — Kim & Stewart LLP

(57) ABSTRACT

A memory device includes memory cells for each of layers arranged in a first direction, the memory cells of each layer including groups of memory cells, the memory cells of each group being arranged in a second direction intersecting the first direction, the groups being arranged in a third direction intersecting the first and second directions, first wirings arranged in the third direction in each layer and respectively connected to the groups in each layer, first transistors each connected to a corresponding first wiring, second wirings each connected to the first transistors of a corresponding layer, third wirings each extending in the first direction and connected to a memory cell in each layer, and fourth wirings each extending in the first direction and connected to a gate of a corresponding first transistor in each layer.

14 Claims, 30 Drawing Sheets

(56)     References Cited

U.S. PATENT DOCUMENTS

| | | | |
|---|---|---|---|
| 2021/0151437 A1 | 5/2021 | Tomishima | |
| 2021/0242210 A1 | 8/2021 | Lee | |
| 2021/0375926 A1 | 12/2021 | Mehandru et al. | |
| 2022/0013524 A1 | 1/2022 | Ryu et al. | |
| 2022/0068931 A1 | 3/2022 | Gomes et al. | |
| 2022/0122975 A1 | 4/2022 | Ryu et al. | |
| 2022/0254397 A1* | 8/2022 | He | G11C 11/2255 |
| 2022/0310612 A1 | 9/2022 | Okajima | |
| 2022/0406783 A1* | 12/2022 | Wada | H10B 12/05 |

* cited by examiner

MEMORY DEVICE

MEMORY CELL ARRAY

120

ROW
CONTROL
CIRCUIT

WL

MC

BL

111

110

WL

MC

BL

111

100

121

122

COLUMN CONTROL CIRCUIT

130

131 132     133

160

READ/WRITE CIRCUIT

140

CLK → CONTROL CIRCUIT

INPUT/OUTPUT CIRCUIT

150

CNT  DT    ADR  CMD

MEMORY CONTROLLER

MEMORY DEVICE

CROSS-REFERENCE TO RELATED APPLICATION

This application is based upon and claims the benefit of priority from Japanese Patent Application No. 2023-046814, filed Mar. 23, 2023, the entire contents of which are incorporated herein by reference.

FIELD

Embodiments described herein relate generally to a memory device.

BACKGROUND

A dynamic random access memory (DRAM) including three-dimensionally stacked memory cells is known.

BRIEF DESCRIPTION OF THE DRAWINGS

FIG. 3 is a circuit diagram showing a connection relationship between each layer of the subarray and a sense circuit in the memory device according to the first embodiment.

FIG. 8 is a cross-sectional view taken along the line VIII-VIII of FIG. 7, which shows a cross-sectional structure of a bit line select transistor in the subarray of the memory device according to the first embodiment.

FIG. 10 is a cross-sectional view taken along the line X-X of FIG. 9, which shows a cross-sectional structure of a memory cell in the subarray of the memory device according to the first embodiment.

DETAILED DESCRIPTION

Figure 1:
FIG. 1 is a block diagram showing a configuration of a memory system including a memory device according to a first embodiment.

Embodiments of this disclosure reduce a manufacturing cost of a memory device.

In general, according to one embodiment, a memory device, comprises a plurality of memory cells provided for each of a plurality of layers arranged in a first direction, the memory cells of each of the layers including a plurality of groups of memory cells, the memory cells of each of the groups being arranged in a second direction intersecting the first direction, the groups being arranged in a third direction intersecting the first and second directions, a plurality of first wirings arranged in the third direction in each of the layers and respectively connected to the groups of memory cells in each of the layers, a plurality of first transistors each connected to a corresponding one of the first wirings, a plurality of second wirings each connected to the first transistors of a corresponding one of the layers, a plurality of third wirings each extending in the first direction and connected to one of the memory cells in each of the layers, and a plurality of fourth wirings each extending in the first direction and connected to a gate of a corresponding one of the first transistors in each of the layers.

Hereinafter, embodiments will be described with reference to drawings. Each embodiment illustrates a device or a method for embodying the technical scope of the disclosure. The drawings are schematic or conceptual. The dimensions and ratios of each drawing are not necessarily the same as actual ones. The technical idea of the present disclosure is not specified by the shape, structure, disposition, or the like of the elements. In the following description, the same reference numerals are added to the components having substantially the same function and configuration. The numerals or characters added to the reference numerals are used to distinguish elements having the same reference numerals and the same configuration.

<1> First Embodiment

A memory device 100 according to a first embodiment is a kind of dynamic random access memory (DRAM) including three-dimensionally stacked memory cells. Hereinafter, details of the memory device 100 according to the first embodiment will be described.

<1-1> Configuration

First, a configuration of the memory device 100 according to the first embodiment will be described. In a part of the drawings referred to below, a three-dimensional rectangular coordinate system is used. An X direction and a Y direction are directions intersecting each other. A Z direction intersects each of the X direction and the Y direction and corresponds to a vertical direction with respect to a surface of a semiconductor substrate. An XY plane (cross section) corresponds to a plane (cross section) formed by the X direction and the Y direction. A YZ plane (cross section) corresponds to a plane (cross section) formed by the Y direction and the Z direction. An XZ plane (cross section) corresponds to a plane (cross section) formed by the X direction and the Z direction. The term "up and down" in the present specification is used with respect to the Z direction, and a direction away from a front surface side of the semiconductor substrate is defined as a positive direction (i.e., upward).

<1-1-1> Overall Configuration of Memory Device 100

FIG. 1 is a block diagram showing a configuration of a memory system 1 including the memory device 100 according to the first embodiment. As shown in FIG. 1, the memory system 1 includes, for example, the memory device 100 and a memory controller 200. The memory device 100 is connected to the memory controller 200 and is configured to read and write data based on a command of the memory controller 200.

The memory device 100 receives, for example, an address ADR, a command CMD, data DT, and a control signal CNT from the memory controller 200. The memory device 100 sends the control signal CNT and the data DT to the memory controller 200. The memory device 100 includes, for example, a memory cell array 110, a row control circuit 120, a column control circuit 130, a read/write circuit 140, an input/output circuit 150, and a control circuit 160.

The memory cell array 110 is a circuit used for storing data. The memory cell array 110 includes a plurality of subarrays 111. Each subarray 111 includes a plurality of memory cells MC, a plurality of word lines WL, and a plurality of bit lines BL. Each memory cell MC may store at least one bit of data. Each memory cell MC is connected between one word line WL and one bit line BL. A row address is assigned to each word line WL. A column address is assigned to each bit line BL. Each memory cell MC may be specified by a row address and a column address.

The row control circuit 120 controls a wiring (hereinafter referred to as "word line WL") extending along a row direction of the memory cell array 110. The row control circuit 120 selects or activates the word line WL according to the address ADR. In addition, the row control circuit 120 sets a non-selected word line WL to a non-selected state (i.e., inactivates the word line WL). The row control circuit 120 applies a predetermined voltage to each of the selected word line WL and the non-selected word line WL. The row control circuit 120 includes, for example, a driver circuit 121 and an address decoder 122. The driver circuit 121 generates a voltage to be applied to the word line WL. The address decoder 122 decodes the address ADR. The row control circuit 120 selects the word line WL based on a decoding result of the address decoder 122.

The column control circuit 130 controls a wiring (hereinafter referred to as "bit line BL") assigned in a column direction in the memory cell array 110. The column control circuit 130 includes, for example, an address decoder 131, a column selection circuit 132, and a sense circuit 133. The address decoder 131 decodes the address ADR. The sense circuit 133 includes a plurality of sense amplifiers SA. The sense amplifier SA may amplify a voltage of the bit line BL. Specifically, when one of the word lines WL in the specific subarray 111 is activated by the row control circuit 120, the voltage of the bit line BL changes due to the data (i.e., charge) stored in the memory cell MC connected to the word line WL. The sense amplifier SA amplifies the change in the voltage of the bit line BL to a voltage that can be read by the read/write circuit 140. The sense amplifier SA re-stores the original data in the memory cell MC in which the data (i.e., charge) is lost by being read to the bit line BL. The sense circuit 133 may be provided for each subarray 111 or may be shared among the plurality of subarrays 111. The column selection circuit 132 controls data exchange between the selected bit line BL and the read/write circuit 140. In a read operation, the column selection circuit 132 outputs the voltage read from the selected bit line BL and amplified by the sense amplifier SA, to the read/write circuit 140. In a write operation, the column selection circuit 132 changes the voltage of the selected bit line BL to a voltage according to write data, and stores new data in the memory cell MC.

The read/write circuit 140 is a circuit capable of writing data to the memory cell array 110 and reading data from the memory cell array 110. When writing the data, the read/write circuit 140 sends, to the memory cell array 110, a signal (i.e., voltage or current) corresponding to the data requested to be written to the memory cell array 110 via the column control circuit 130. When reading the data, a signal (i.e., voltage or current) corresponding to the data read from the memory cell array 110 is received from the memory cell array 110 via the column control circuit 130. The memory device 100 may be separately provided with a circuit for writing the data and a circuit for reading the data.

The input/output circuit 150 is an interface circuit that controls communication between the memory device 100 and the memory controller 200. The input/output circuit 150 receives the command CMD, the address ADR, the data DT (for example, the data requested to be written to the memory cell array 110), a plurality of the control signals CNT, and the like from the memory controller 200. The input/output circuit 150 sends the control signal CNT and the data DT (for example, the data read from the memory cell array 110) to the memory controller 200.

The control circuit 160 controls the row control circuit 120, the column control circuit 130, the read/write circuit 140, and the like based on the command CMD and the control signal CNT, and causes the memory device 100 to execute a desired operation. The control circuit 160 may execute a refresh operation of the data in the memory cell array 110 in addition to writing of the data and reading of the data. The refresh operation is an operation of activating the word line WL to read the data stored in each memory cell MC to the bit line BL and writing the data read by the sense circuit 133 back to the memory cell MC. In addition, the control circuit 160 controls the row control circuit 120, the column control circuit 130, the read/write circuit 140, and the like at a timing synchronized with a clock signal CLK. In the memory device 100, writing of the data and reading of the data are executed at a timing synchronized with the clock signal CLK. The clock signal CLK may be generated in the memory device 100 or may be supplied from the outside. The control circuit 160 may also be called a sequencer, an internal controller, or the like.

The memory device 100 is not limited to the configuration described above. The memory device 100 may include a control circuit that controls the refresh operation, a clock generation circuit, an internal voltage generation circuit, and the like.

<1-1-2> Circuit Configuration of Subarray 111

Figure 2:
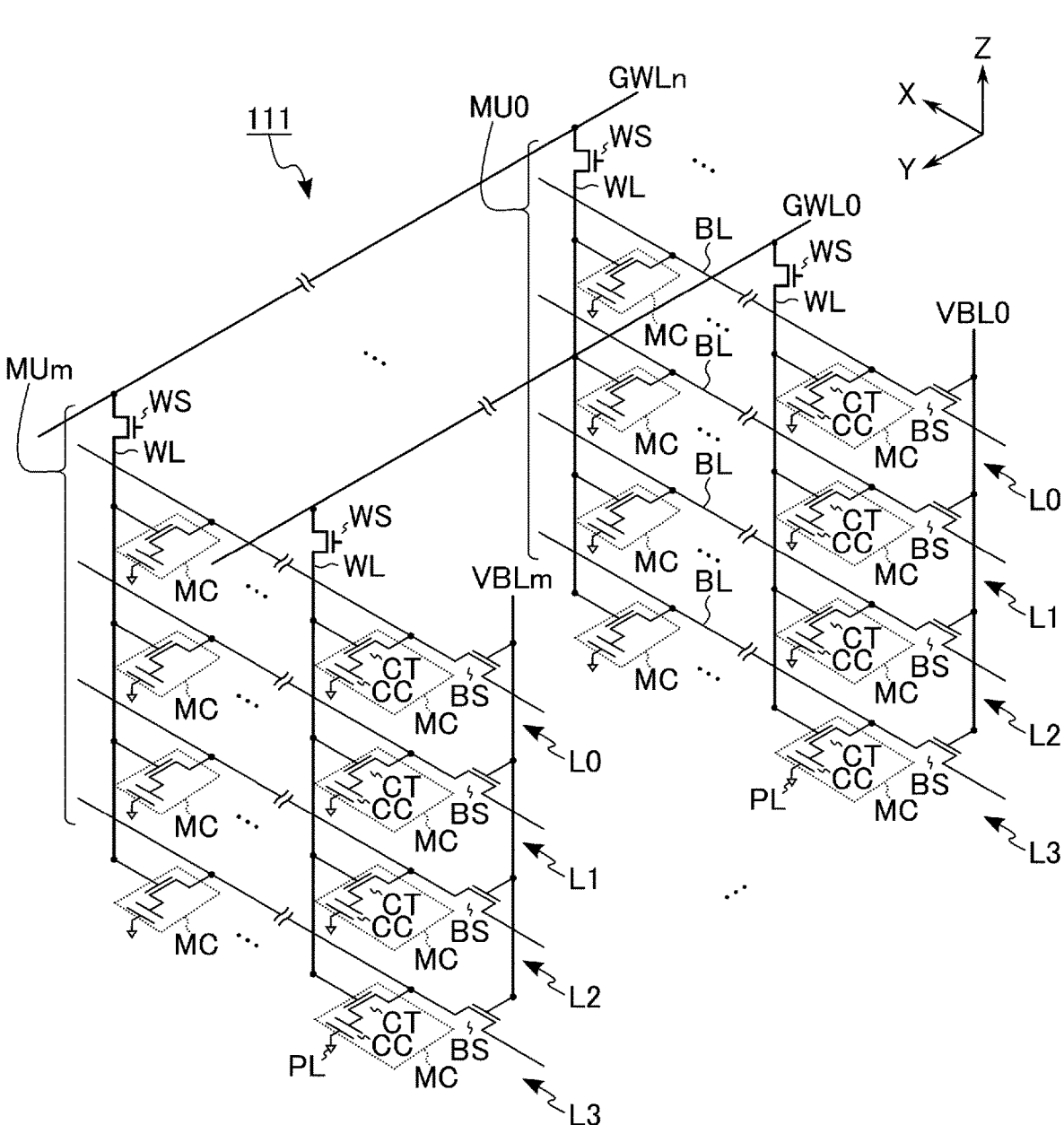
FIG. 2 is a circuit diagram showing a circuit configuration of a subarray in the memory device according to the first embodiment.

FIG. 2 is a circuit diagram showing a circuit configuration of the subarray 111 in the memory device 100 according to the first embodiment. The three-dimensional rectangular coordinate system shown in FIG. 2 corresponds to the extension directions of the wirings. Each word line WL has a portion extending in the Z direction. Each bit line BL has a portion extending in the X direction. As shown in FIG. 2, the subarray 111 has, for example, four layers L0 to L3. Each layer L includes a plurality of memory cells MC arranged in a lattice shape in the XY plane. In addition, the subarray 111 further includes a plurality of word line select transistors WS, a plurality of global word lines GWL0 to GWLn (n is an integer of 1 or more), a plurality of bit line select transistors BS, and a plurality of vertical bit lines VBL0 to VBLm (m is an integer of 1 or more). Each global word line GWL is a wiring having a portion extending in the Y direction. Each vertical bit line VBL is a wiring having a portion extending in the Z direction. The subarray 111 is divided into a plurality of memory units MU0 to MUm respectively correlated with the vertical bit lines VBL0 to VBLm.

Hereinafter, a connection relationship of each configuration will be described with focusing on the memory unit MU0.

The memory unit MU0 includes four bit lines BL, four bit line select transistors BS, (n+1) word lines WL, and (n+1) word line select transistors WS, in correspondence to the four layers L0 to L3. In each layer L, one end of each of the four bit line select transistors BS is connected to the bit line BL provided in the same layer L. In each layer L, one memory cell MC is connected between the bit line BL and each of the (n+1) word lines WL. In this example, four memory cells MC stacked in correspondence to the layers L0 to L3 are connected to each word line WL.

Each memory cell MC includes a cell transistor CT and a cell capacitor CC. The cell transistor CT is a switch configured to switch between an electrically connected state and an electrically insulated state between the memory cell MC and the bit line BL. The cell transistor CT functions as a selection element of the memory cell MC. One end of the cell transistor CT functions as one of a source end and a drain end of the transistor. The other end of the cell transistor CT functions as the other of the source end and the drain end of the transistor. The cell capacitor CC stores an amount of charge associated with data of one bit or more. One end of the cell transistor CT is connected to the correlated bit line BL. The other end of the cell transistor CT is connected to one electrode of the cell capacitor CC. The other electrode of the cell capacitor CC is connected to a plate line PL. The cell transistor CT is, for example, a field effect transistor. The cell capacitor CC is a capacitance element. A plate voltage (for example, a ground voltage) is applied to the plate line PL. The cell transistor CT may also be called a "transistor". The cell capacitor CC may also be called a "capacitor". The plate line PL may also be called a "plate electrode". For example, the plate line PL is shared in the memory unit MU. In addition, the plate line PL may be shared among the plurality of memory units MU.

In the memory unit MU0, a gate end of the bit line select transistor BS of each layer L is connected to the vertical bit line VBL0. Each word line WL is connected to a gate end of each of a plurality of the cell transistors CT provided in the plurality of memory cells MC arranged in the Z direction. The (n+1) word line select transistors WS are correlated with (n+1) word lines WL, respectively. The (n+1) word lines WL are connected to the global word lines GWL0 to GWLn, respectively, via the correlated word line select transistor WS.

The other memory units MU have the same configuration as the memory unit MU0. The vertical bit lines VBL0 to VBLm are used to control the plurality of bit line select transistors BS provided in the memory units MU0 to MUm, and may be controlled separately. Each global word line GWL is connected to (m+1) word line select transistors WS arranged in the same row. Each global word line GWL is used to supply a voltage to the correlated word line WL and may be controlled separately. Each word line select transistor WS is used to select the word line WL and may be controlled separately. The voltage applied to the global word line GWL may be transferred to the correlated word line WL via the word line select transistor WS having a gate end to which a voltage of an "H" level is applied.

The subarray 111 is not limited to the circuit configuration described above. The number of the layers L provided in the subarray 111 is not limited to four, and need only be plural. The number of the memory cells MC stacked in the Z direction changes depending on the number of the layers L. The plate line PL may be divided according to the control unit of the subarray 111.

In the following description, the plurality of bit line select transistors BS connected to the vertical bit lines VBL0 to VBLm are referred to as bit line select transistors BS0 to BSm, respectively. The plurality of bit lines BL connected to the bit line select transistors BS0 to BSm are referred to as bit lines BL0 to BLm, respectively. In addition, in the following description, coordinates (i, j) defined in the XY plane are used. "i" corresponds to the number of the correlated global word line GWL. "j" corresponds to the number of the correlated vertical bit line VBL. The coordinates (i, j) added to the word line WL or the memory cell MC indicate XY coordinates of the word line WL or the memory cell MC. For example, in each layer L, the memory cells MC(0,0), MC(1,0), . . . , and MC(n,0) are connected to the bit line BL0. The word lines WL(0,0), WL(1,0), . . . , and WL(n,0) are connected to the memory cells MC(0,0), MC(1,0), . . . , and MC(n,0), respectively. In each layer L, the memory cells MC(0,1), MC(1,1), . . . , and MC(n,1) are connected to the bit line BL1. The word lines WL(0,1), WL(1,1), . . . , and WL(n,1) are connected to the memory cells MC(0,1), MC(1, 1), . . . , and MC(n,1), respectively. Hereinafter, the coordinates correlated with the word line WL and the memory cell MC are determined in the same manner.

<1-1-3> Connection Relationship Between Subarray 111 and Sense Circuit 133

Hereinafter, an example of a connection relationship between the subarray 111 and the sense circuit 133 in the first embodiment will be described. In the first embodiment, the subarray 111 and the sense circuit 133 are arranged side by side in the X direction.

Figure 3:
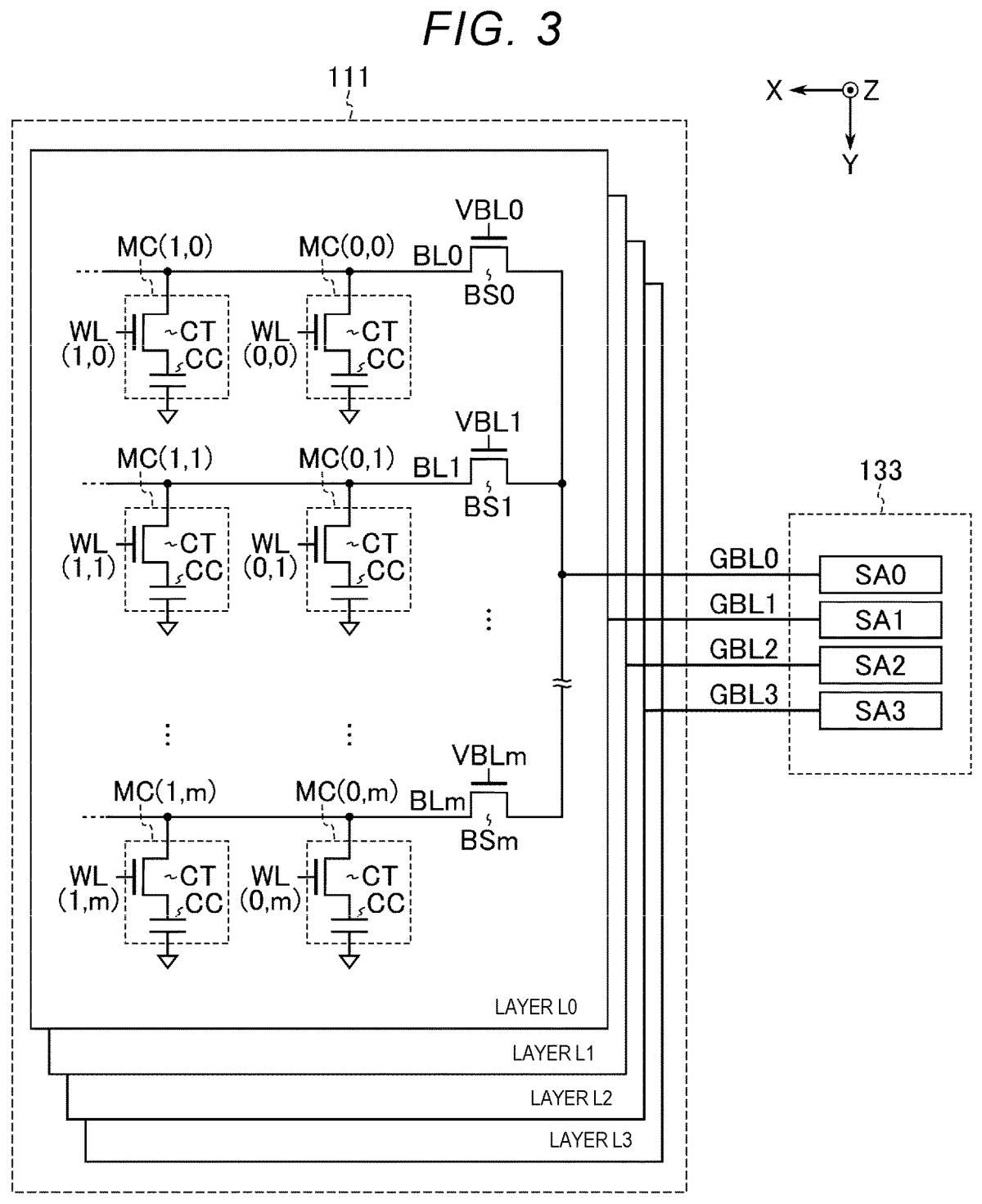

FIG. 3 is a circuit diagram showing a connection relationship between each layer of the subarray 111 and the sense circuit 133 in the memory device 100 according to the first embodiment. FIG. 3 shows a circuit configuration in the layer L0 among the layers L0 to L3 of the subarray 111 and a configuration of the sense circuit 133. As shown in FIG. 3, the subarray 111 of the first embodiment further has the global bit lines GBL whose number is the same as the number of the layers L. In other words, one global bit line GBL is provided for each layer L. Specifically, the subarray 111 of the first embodiment has four global bit lines GBL0 to GBL3. The global bit line GBL0 is connected to the other end of each of the bit line select transistors BS0 to BSm of the layer L0. The global bit line GBL1 is connected to the other end of each of the bit line select transistors BS0 to BSm of the layer L1 (not shown). The global bit line GBL2 is connected to the other end of each of the bit line select transistors BS0 to BSm of the layer L2 (not shown). The global bit line GBL3 is connected to the other end of each of the bit line select transistors BS0 to BSm of the layer L3 (not shown).

In addition, the sense circuit 133 of the first embodiment has the sense amplifiers SA whose number is the same as the number of the layers L of the subarray 111. In other words, one sense amplifier SA is provided for each layer L. Specifically, the sense circuit 133 of the first embodiment has four sense amplifiers SA0 to SA3. The sense amplifiers SA0 to SA3 are associated with the layers L0 to L3 of the subarray 111, respectively. The sense amplifiers SA0 to SA3 are connected to the global bit lines GBL0 to GBL3, respectively.

Figure 4:
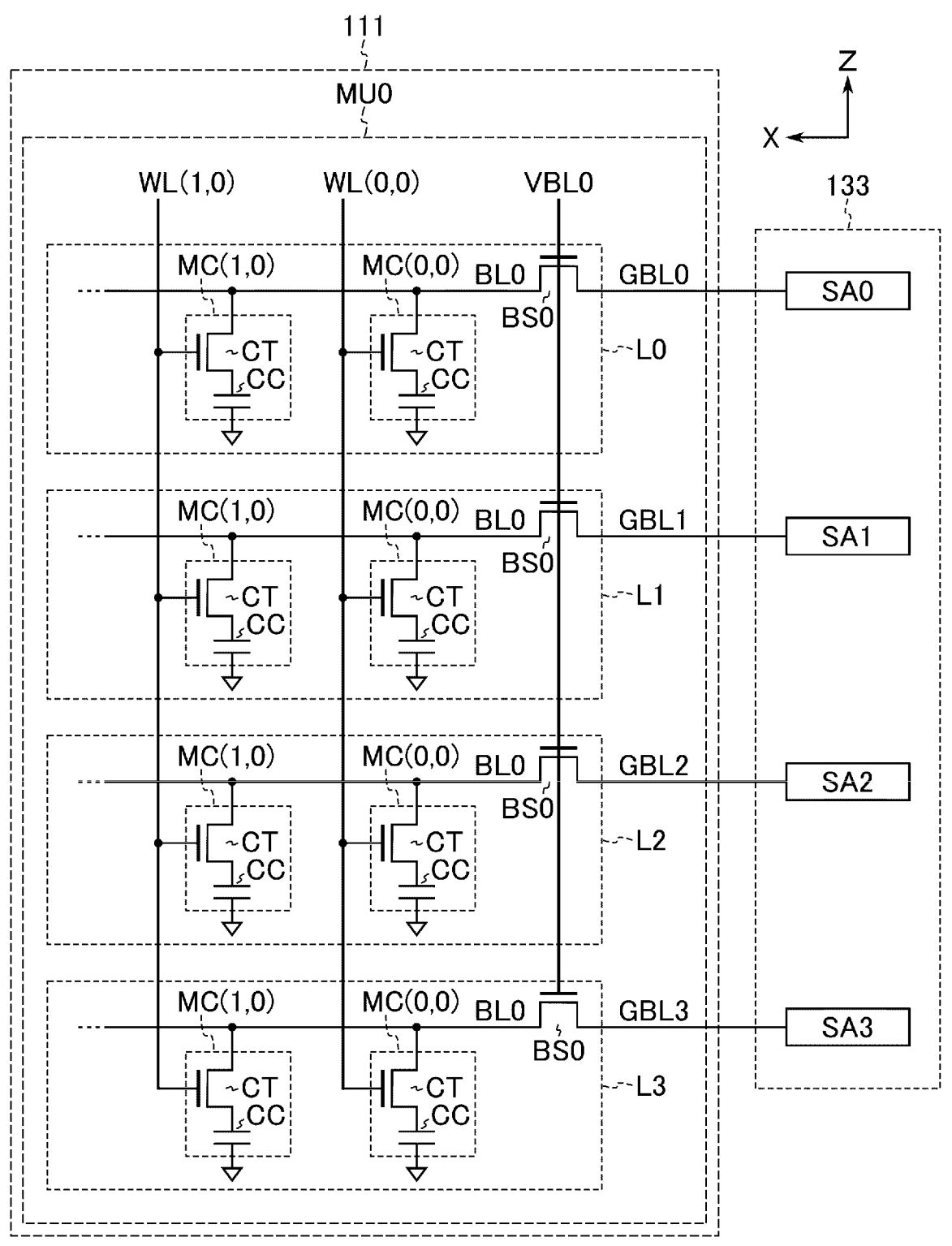
FIG. 4 is a circuit diagram showing a connection relationship between one memory unit in the subarray and the sense circuit in the memory device according to the first embodiment.

FIG. 4 is a circuit diagram showing the connection relationship between one memory unit MU0 in the subarray 111 and the sense circuit 133 in the memory device 100 according to the first embodiment. FIG. 4 shows a circuit configuration of the memory unit MU0 of the subarray 111 and a configuration of the sense circuit 133. As shown in FIG. 4, the global bit line GBL0 is connected to the other end of the bit line select transistor BS0 of the layer L0. The global bit line GBL1 is connected to the other end of the bit line select transistor BS0 of the layer L1. The global bit line GBL2 is connected to the other end of the bit line select transistor BS0 of the layer L2. The global bit line GBL3 is connected to the other end of the bit line select transistor BS0 of the layer L3. The connection relationship between the global bit line GBL and the bit line select transistor BS in the other memory units MU is the same as that of the memory unit MU0.

The vertical bit line VBL0 is connected to the gate ends of the four bit line select transistors BS0 provided in the memory unit MU0. That is, based on the control of the vertical bit line VBL, the plurality of bit lines BL in the memory unit and the plurality of global bit lines GBL provided in the subarray 111 may be electrically connected to each other. As described above, the subarray 111 may electrically connect the plurality of bit lines BL provided in the selected memory unit MU and stacked in the Z direction to the plurality of sense amplifiers SA0 to SA3 provided in the sense circuit 133. In addition, when any of the plurality of word lines WL is selected, the memory unit MU may transfer the charges accumulated in the cell capacitors CC of the four memory cells MC connected to the selected word line WL to the four bit lines BL.

<1-1-4> Structure of Subarray 111

Figure 5:
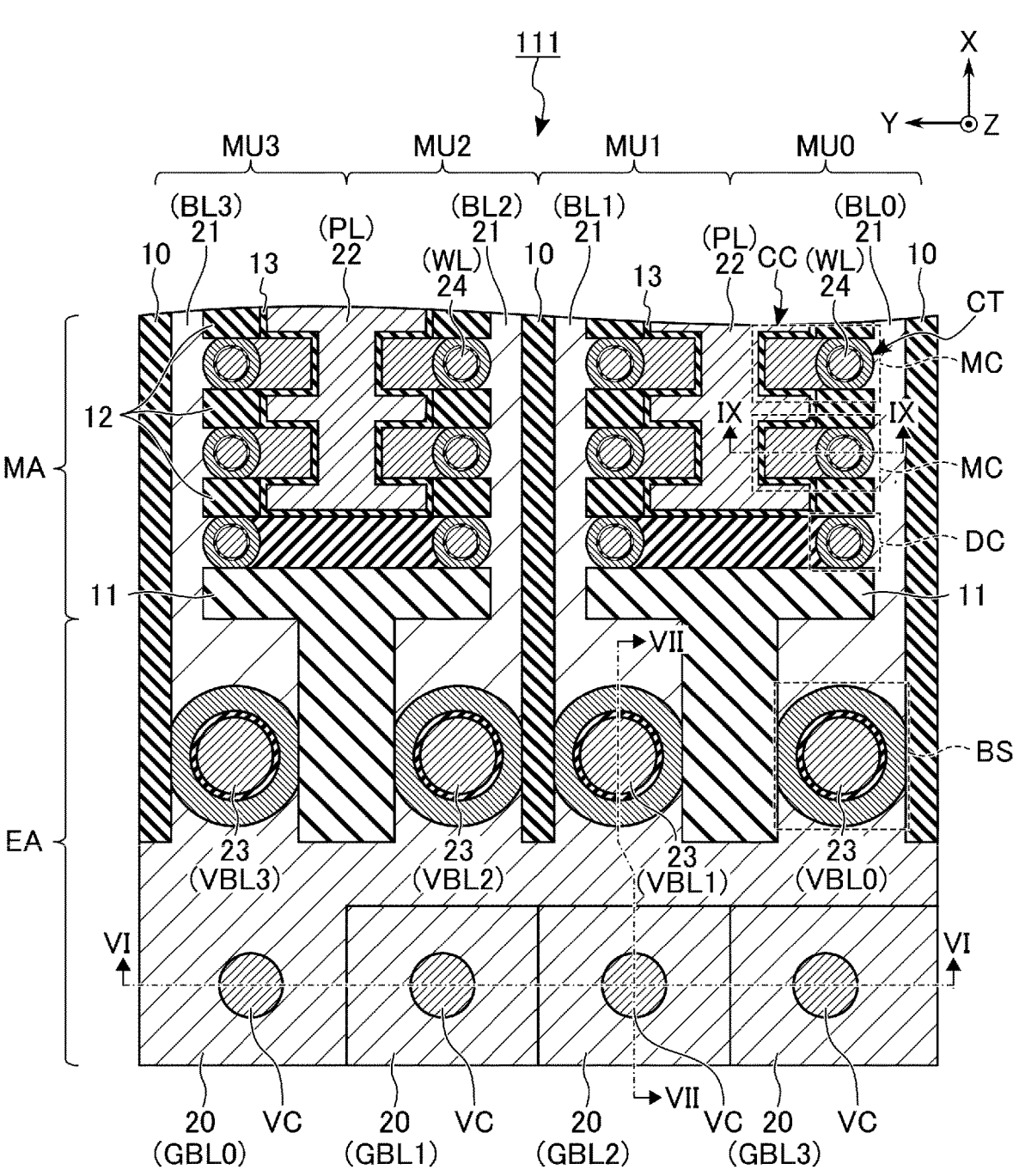
FIG. 5 is a plan view showing a planar layout of the subarray in the memory device according to the first embodiment.

Hereinafter, an example of a structure of the subarray 111 in the first embodiment will be described.
1: Planar Layout of Subarray 111
FIG. 5 is a plan view showing a planar layout of the subarray 111 in the memory device 100 according to the first embodiment. FIG. 5 shows an extracted part of regions corresponding to four memory units MU0 to MU3 arranged in the Y direction. As shown in FIG. 5, the subarray 111 has a memory region MA and an end region EA. The memory region MA is a region in which the memory cells MC and the like are disposed. The plurality of memory cells MC are arranged in the X direction side by side for each memory unit MU in the memory region MA. In this example, a dummy cell DC having a structure similar to that of the memory cell MC disposed at an end of the memory region MA is shown. The dummy cell DC corresponds to the memory cell MC that is not used for data storage. The end region EA is a region in which the bit line select transistors BS, the global bit lines GBL, and the like are disposed. The bit line select transistor BS is disposed for each memory unit MU in the end region EA. In addition, the subarray 111 has, for example, insulator layers 10 to 13, conductor layers 20 to 24, and a plurality of contacts VC.

Each insulator layer 10 is an insulator having a portion extending in the X direction from the memory region MA to the end region EA. For example, the insulator layer 10 is disposed to divide the plurality of memory units MU arranged in the Y direction into two pieces. In the illustrated region, the set of memory units MU0 and MU1 is interposed between the two insulator layers 10 in the Y direction. The set of memory units MU2 and MU3 is interposed between the two insulator layers 10 in the Y direction. The bit line select transistor BS of the memory unit MU0 and the bit line select transistor BS of the memory unit MU1 are in contact with the two insulator layers 10 between which the set of memory units MU0 and MU1 is interposed. The bit line select transistor BS of the memory unit MU2 and the bit line select transistor BS of the memory unit MU3 are in contact with the two insulator layers 10 between which the set of memory units MU2 and MU3 is interposed.

Each conductor layer 20 is used as the global bit line GBL and is provided in the end region EA according to the number of the global bit lines GBL. In this example, the four conductor layers 20 are provided in correspondence to the four global bit lines GBL0 to GBL3. The four conductor layers 20 are arranged apart from each other in the Z direction (not shown). The four conductor layers 20 have terrace portions arranged side by side in the Y direction. The terrace portion is a portion that does not overlap the conductor layer 20 provided in the upper layer. The contact VC is connected to the terrace portion of each of the four conductor layers 20. Each global bit line GBL is electrically connected to the corresponding sense amplifier SA via the contact VC connected to the global bit line GBL. In addition, each of the four conductor layers 20 is connected to one end of the bit line select transistor BS of the memory units MU0 to MUm.

Each insulator layer 11 is disposed between the insulator layers 10 adjacent to each other and is in contact with the bit line select transistor BS of each of the memory units MU adjacent to each other. Specifically, the insulator layer 11 correlated with the memory units MU0 and MU1 is in contact with the bit line select transistor BS of the memory unit MU0 and the bit line select transistor BS of the memory unit MU1. The insulator layer 11 correlated with the memory units MU2 and MU3 is in contact with the bit line select transistor BS of the memory unit MU2 and the bit line select transistor BS of the memory unit MU3. The insulator layer 12 is an insulator that separates and insulates the memory cells MC adjacent to each other in the X direction. The insulator layer 12 is also provided between the memory cell MC and the dummy cell DC. Each insulator layer 13 is disposed between the insulator layers 10 adjacent to each other, and has a portion provided along the insulator layer 12 and a portion provided in the cell capacitor CC of the memory cell MC.

Each conductor layer 21 is used as the bit line BL. Each conductor layer 21 has a portion extending along the insulator layer 10 in the X direction in the memory region MA. The conductor layer 21 corresponding to the bit line BL0 is connected to the bit line select transistor BS of the memory unit MU0. The conductor layer 21 corresponding to the bit line BL1 is connected to the bit line select transistor BS of the memory unit MU1. The conductor layer 21 corresponding to the bit line BL2 is connected to the bit line select transistor BS of the memory unit MU2. The conductor layer 21 corresponding to the bit line BL3 is connected to the bit line select transistor BS of the memory unit MU3. The conductor layers 21 adjacent to each other in the Y direction between the insulator layers 10 adjacent to each other are separated from each other via the insulator layers 11 and 12 and the plurality of memory cells MC. Each conductor layer 22 has a portion provided along the insulator layer 13 and is surrounded by the insulator layer 13 in plan view. The conductor layer 22 is used as the plate line PL. Each memory cell MC is interposed between the conductor layer 21 and the conductor layer 22 in the Y direction.

Each bit line select transistor BS has a ring-shaped portion in top view. The conductor layer 23 is used as a gate electrode of the bit line select transistor BS, and is provided inside the ring-shaped portion of the bit line select transistor BS. A portion corresponding to the cell transistor CT of each memory cell MC has a ring-shaped portion in top view. The conductor layer 24 is used as a gate electrode of the cell transistor CT, and is provided inside the ring-shaped portion of the cell transistor CT. A detailed structure of each of the bit line select transistor BS and the memory cell MC will be described below.

2: Cross-Sectional Structure of End Region EA

Figure 6:
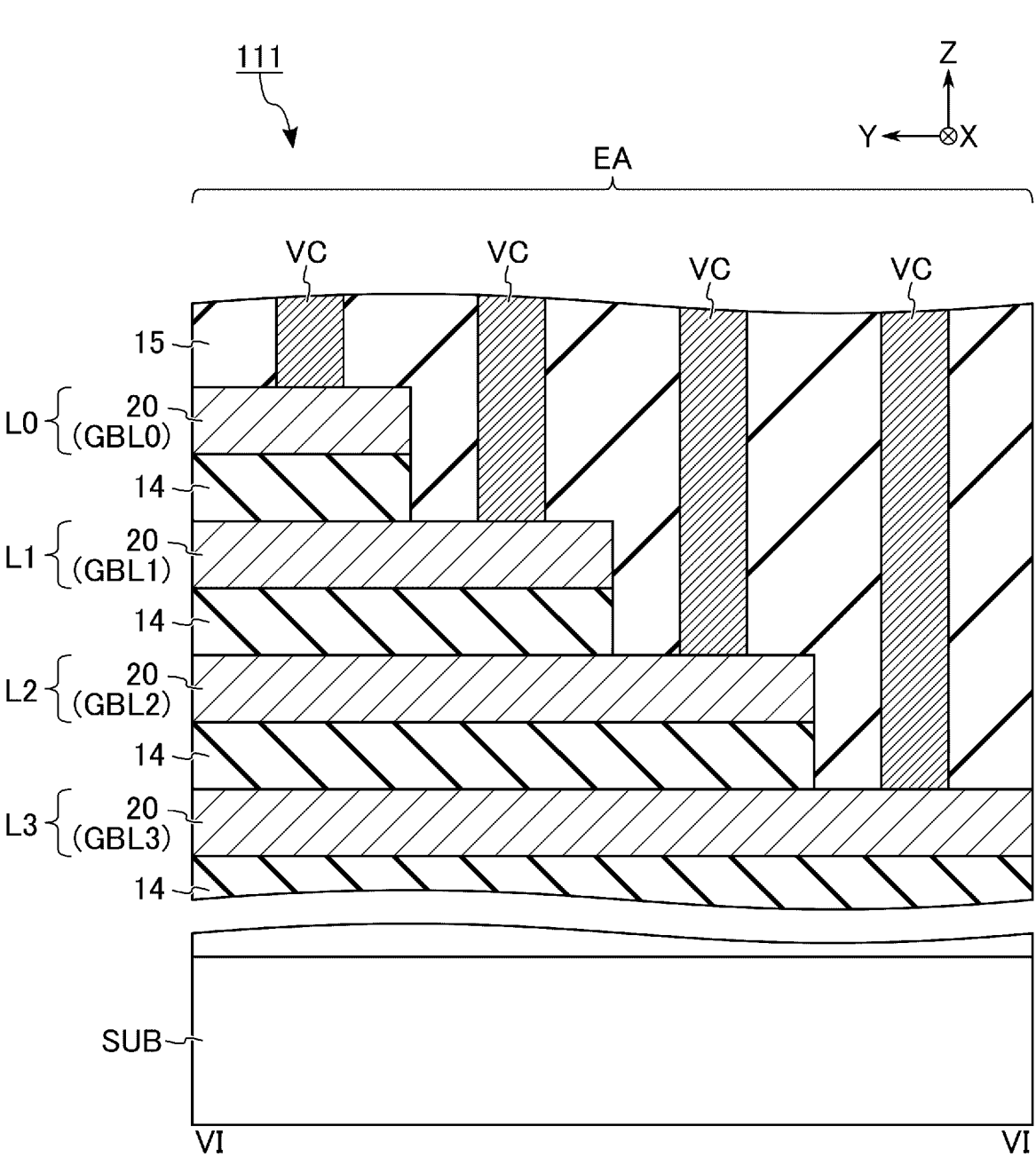
FIG. 6 is a cross-sectional view taken along the line VI-VI of FIG. 5, which shows a cross-sectional structure in an end region of the subarray in the memory device according to the first embodiment.

FIG. 6 is a cross-sectional view taken along the line VI-VI of FIG. 5, which shows a cross-sectional structure in the end region EA of the subarray 111 in the memory device 100 according to the first embodiment. As shown in FIG. 6, the subarray 111 further has, for example, a semiconductor substrate SUB and insulator layers 14 and 15.

The semiconductor substrate SUB is a substrate used for formation of the memory device 100. The insulator layer 14 and the conductor layer 20 are alternately stacked above the semiconductor substrate SUB. The insulator layer 14 corresponds to an interlayer insulating film. The four illustrated conductor layers 20 are used as the global bit lines GBL0 to GBL3 in order from the top. That is, the conductor layer 20 used as the global bit line GBL0 is disposed in the layer L0. The conductor layer 20 used as the global bit line GBL1 is disposed in the layer L1. The conductor layer 20 used as the global bit line GBL2 is disposed in the layer L2. The conductor layer 20 used as the global bit line GBL3 is disposed in the layer L3.

The four conductor layers 20 have stepped-shaped portions. The stepped-shaped portion corresponds to the terrace portion of each conductor layer 20. An insulator layer 15 is provided on the uppermost conductor layer 20. The insulator layer 15 covers the stepped-shaped portions of the four conductor layers 20. The plurality of contact VC penetrate the insulator layer 15. A bottom portion of each contact VC is in contact with the correlated conductor layer 20. The plurality of conductor layers 20 may not have a stepped-shaped portion. In this case, each contact VC has a bottom portion in contact with the correlated conductor layer 20, and penetrates the conductor layer 20 in the upper layer. Then, the contact VC and the conductor layer 20 in the upper layer are separated and insulated from each other by a spacer insulating film.

Figure 7:
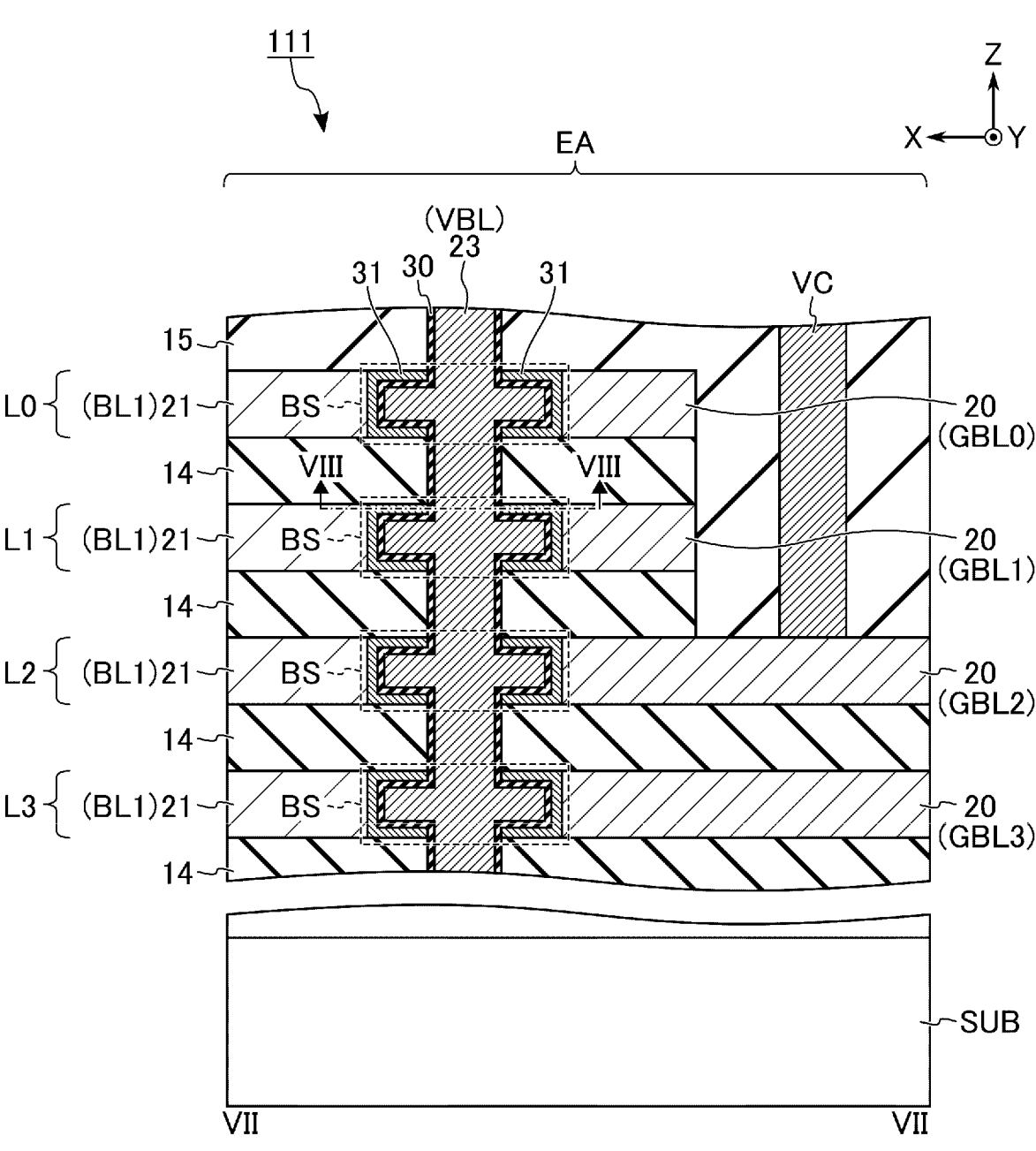
FIG. 7 is a cross-sectional view taken along the line VII-VII of FIG. 5, which shows the cross-sectional structure in the end region of the subarray in the memory device according to the first embodiment.

FIG. 7 is a cross-sectional view taken along the line VII-VII of FIG. 5, which shows the cross-sectional structure in the end region EA of the memory unit MU1 in the subarray 111 of the memory device 100 according to the first embodiment. As shown in FIG. 7, the insulator layer 14 and the conductor layer 21 are alternately stacked above the semiconductor substrate SUB. The four conductor layers 21 are used as the bit lines BL1 of the layers L0 to L3 in order from the top. The conductor layer 23 extends in the Z direction and intersects with each of the insulator layers 14 and 15 and the plurality of conductor layers 20 and 21. An outer diameter of a portion of the conductor layer 23 facing the conductor layers 20 and 21 in the XY cross section including each of the conductor layers 20 and 21 is larger than an outer diameter of a portion of the conductor layer 23 facing the insulator layer 14 in the XY cross section including the insulator layer 14. In other words, the conductor layer 23 has a shape thicker at a height facing each of the conductor layers 20 and 21 than at a height facing the insulator layer 14.

In addition, the subarray 111 further has an insulator layer 30 and a plurality of semiconductor layers 31. The insulator layer 30 covers an outer peripheral portion of the conductor layer 23. The semiconductor layer 31 has a portion between the conductor layer 20 and the insulator layer 30, a portion between the conductor layer 21 and the insulator layer 30, and a portion between the insulator layer 14 or the insulator layer 15 and the insulator layer 30. The conductor layer 23 and the semiconductor layer 31 are separated and insulated from each other by the insulator layer 30. The semiconductor layer 31 is electrically connected to each of the conductor layers 20 and 21 in the same layer L via a region which is not shown.

Figure 8:
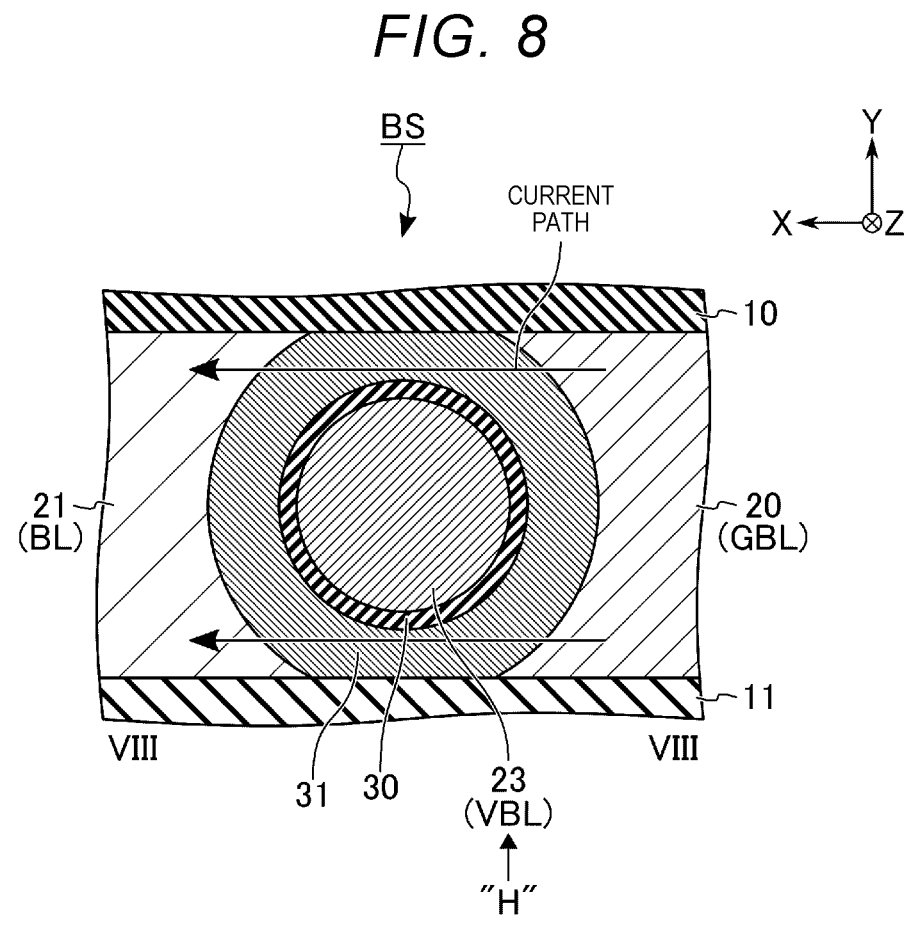

FIG. 8 is a cross-sectional view taken along the line VIII-VIII of FIG. 7, which shows a cross-sectional structure of the bit line select transistor BS in the subarray 111 of the memory device 100 according to the first embodiment. As shown in FIG. 8, the insulator layer 30 has a ring shape in top view. The semiconductor layer 31 covers a side surface (i.e., an outer peripheral portion) of the insulator layer 30 in top view. The conductor layers 20 and 21 are connected to each other via the semiconductor layer 31. The insulator layer 30 functions as a gate insulating film of the bit line select transistor BS. The semiconductor layer 31 is used as a channel of the bit line select transistor BS. For example, when a voltage of an "H" level is applied to the conductor layer 23 (i.e., the vertical bit line VBL), the bit line select transistor BS is turned on. As a result, a current path is formed between the conductor layers 20 and 21. The bit line BL (i.e., the conductor layer 21) is charged via the global bit line GBL (i.e., the conductor layer 20) and the semiconductor layer 31. In addition, the charge accumulated in the bit line BL (i.e., the conductor layer 21) is released to the global bit line GBL (i.e., the conductor layer 20) via the semiconductor layer 31.

3: Cross-Sectional Structure of Cell Region CA

Figure 9:
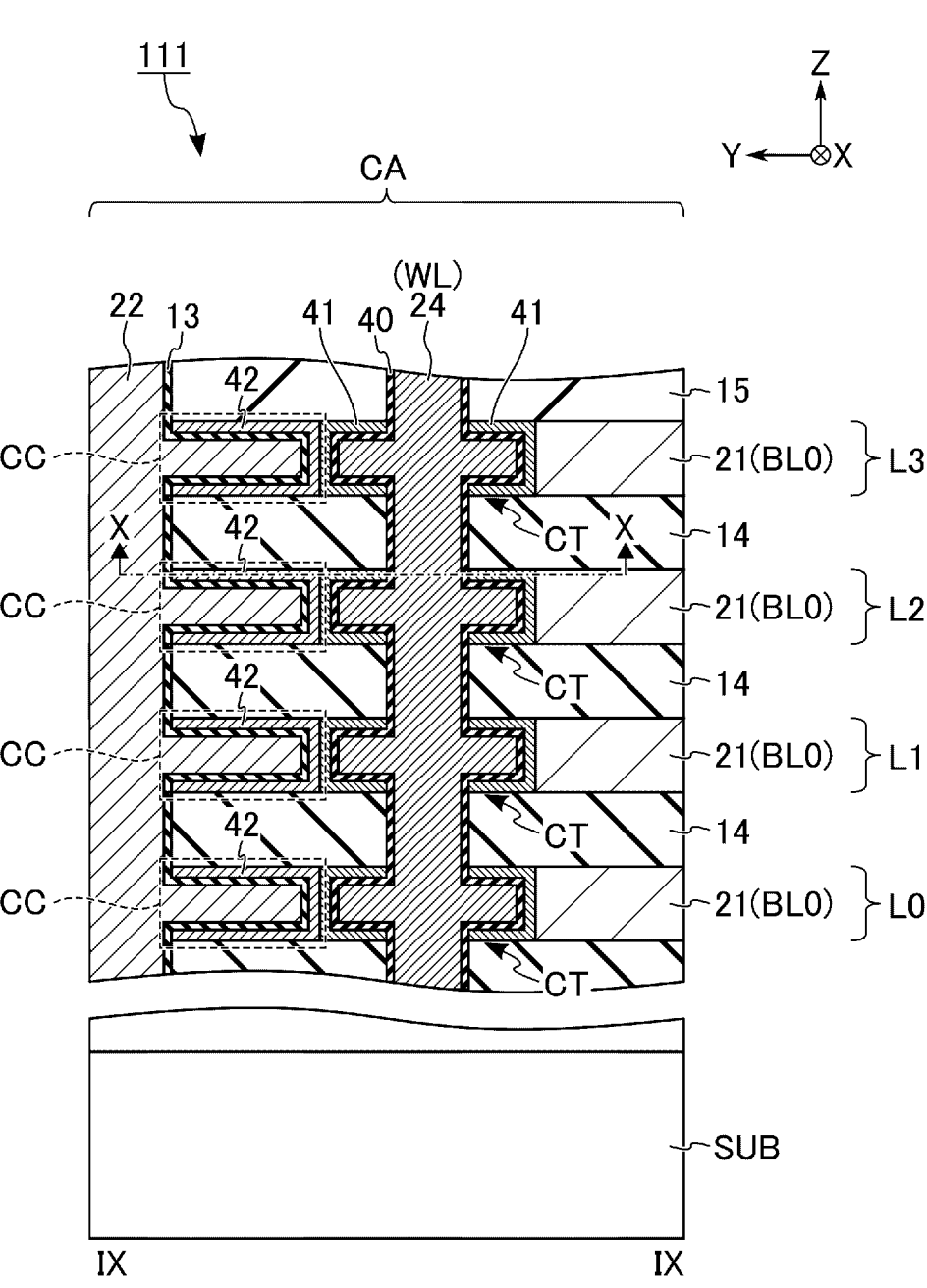
FIG. 9 is a cross-sectional view taken along the line IX-IX of FIG. 5, which shows a cross-sectional structure in a cell region in the subarray of the memory device according to the first embodiment.

FIG. 9 is a cross-sectional view taken along the line IX-IX of FIG. 5, which shows a cross-sectional structure in a cell region CA of the subarray 111 in the memory device 100 according to the first embodiment. As shown in FIG. 9, the conductor layer 24 extends in the Z direction and intersects with each of the insulator layers 14 and 15 and the plurality of conductor layer 21. An outer diameter of a portion of the conductor layer 24 facing the conductor layers 21 in the XY cross section including the conductor layers 21 is larger than an outer diameter of a portion of the conductor layer 24 facing the insulator layer 14 in the XY cross section including the insulator layer 14. In other words, the conductor layer 24 has a shape thicker at a height facing the conductor layers 21 than at a height facing the insulator layer 14.

In addition, the subarray 111 further has an insulator layer 40, a plurality of semiconductor layers 41, and a plurality of conductor layers 42. The insulator layer 40 covers an outer peripheral portion of the conductor layer 24. The semiconductor layer 41 has a portion between the conductor layer 21 and the insulator layer 40, a portion between the conductor layer 24 and the insulator layer 14 or the insulator layer 15, and a portion between the insulator layers 40 and 13. The conductor layer 24 and the semiconductor layer 41 are separated and insulated from each other by the insulator layer 40. The conductor layer 42 has a shape extending along an outer peripheral portion of the insulator layer 13 in each layer L. The conductor layer 42 faces the conductor layer 22 with the insulator layer 13 interposed therebetween. The conductor layers 42 adjacent to each other in the Z direction are separated and insulated from each other by the insulator layer 14. The conductor layer 42 functions as one electrode of the cell capacitor CC. A portion of the conductor layer 22 provided along the conductor layer 42 functions as the other electrode of the cell capacitor CC. The semiconductor layer 41 is electrically connected to the conductor layer 42 and is electrically connected to the conductor layer 21 provided in the same layer L via a region which is not shown.

Figure 10:
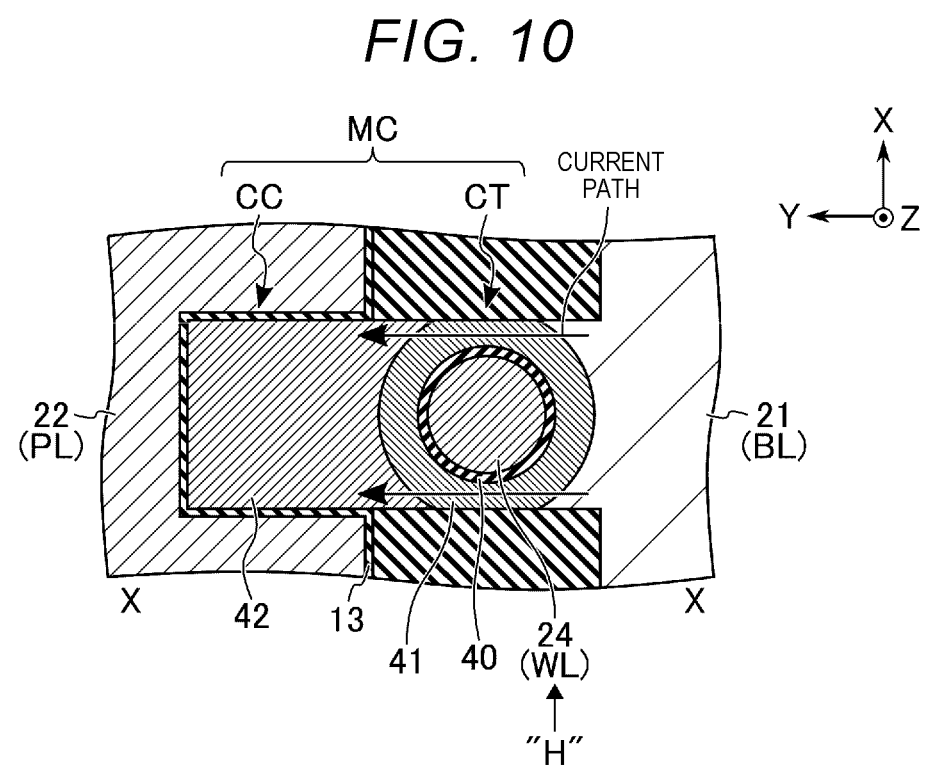

FIG. 10 is a cross-sectional view taken along the line X-X of FIG. 9, which shows a cross-sectional structure of the memory cell MC in the subarray 111 of the memory device 100 according to the first embodiment. As shown in FIG. 10, the insulator layer 40 has a ring shape in top view. The semiconductor layer 41 covers a side surface (i.e., an outer peripheral portion) of the insulator layer 40 in top view. The conductor layers 21 and 42 are connected to each other via the semiconductor layer 41. The insulator layer 40 functions as a gate insulating film of the cell transistor CT. The semiconductor layer 41 is used as a channel of the cell transistor CT. For example, when a voltage of an "H" level is applied to the conductor layer 24 (i.e., the word line WL), the cell transistor CT is turned on. As a result, a current path is formed between the conductor layers 21 and 42. For example, the cell capacitor CC is charged via the bit line BL (i.e., the conductor layer 21) and the semiconductor layer 41. In addition, the charge accumulated in the cell capacitor CC is released to the bit line BL (i.e., the conductor layer 21) via the semiconductor layer 41.

<1-2> Operation

Next, an operation of the memory device 100 according to the first embodiment will be described.

Figure 11:
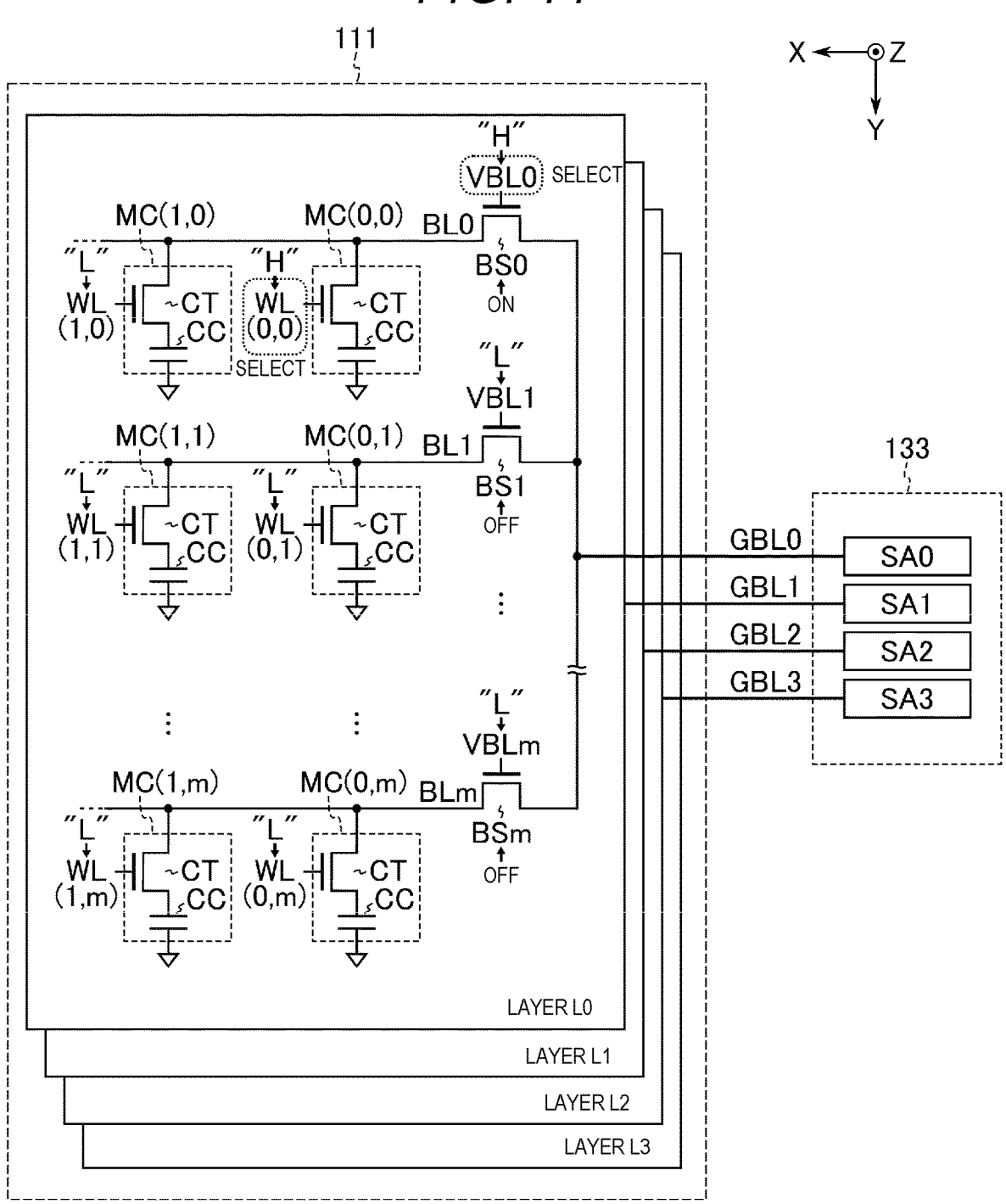
FIG. 11 is a schematic view for explaining a method of selecting a memory cell with focusing on one layer of the subarray in the memory device according to the first embodiment.

FIG. 11 is a schematic view for explaining a method of selecting a memory cell MC with focusing on one layer (L0) of the subarray 111 in the memory device 100 according to the first embodiment. FIG. 11 shows examples of a voltage and the like applied to each wiring when data stored in the memory cell MC(0,0) is read. As shown in FIG. 11, when reading the data stored in the memory cell MC(0,0), the word line WL(0,0) and the vertical bit line VBL0 are selected. Specifically, a voltage of an "H" level is applied to each of the selected word line WL(0,0) and the selected vertical bit line VBL0. Then, a voltage of an "L" level is applied to each of the non-selected word line WL and the non-selected vertical bit line VBL. As a result, in the layer L0, each of the bit line select transistor BS0 and the cell transistor CT of the memory cell MC(0,0) is turned on, and each of the other bit line select transistors BS and the cell transistors CT of the other memory cells MC is turned off. Accordingly, in the layer L0, a voltage based on the charge accumulated in the cell capacitor CC of the selected memory cell MC(0,0) is transferred to the global bit line GBL0 via the bit line BL0 and the bit line select transistor BS0.

Figure 12:
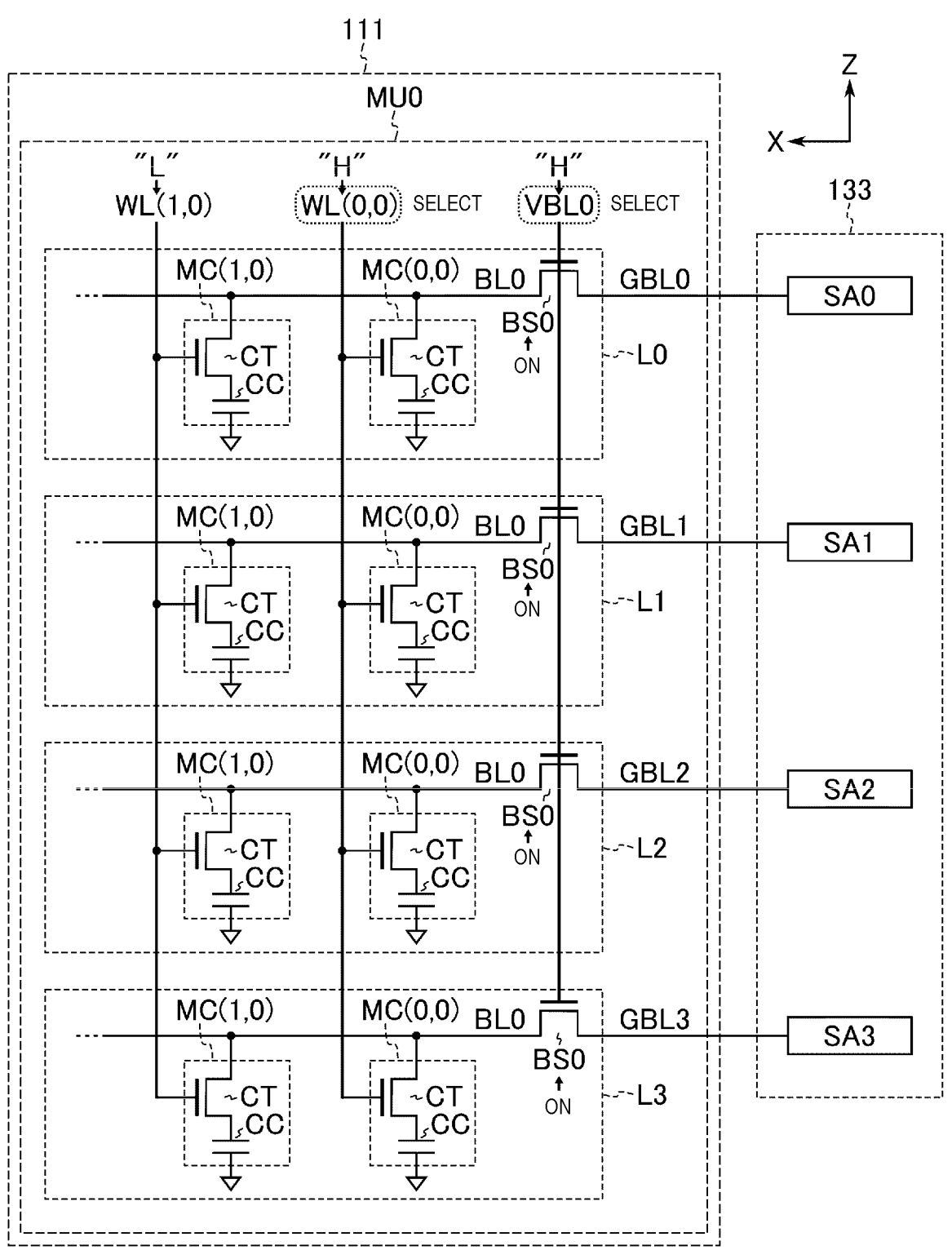
FIG. 12 is a schematic view for explaining a method of selecting a memory cell with focusing on one memory unit in the subarray of the memory device according to the first embodiment.

FIG. 12 is a schematic view for explaining a method of selecting a memory cell with focusing on one memory unit (MU0) in the subarray 111 of the memory device 100 according to the third embodiment. FIG. 12 shows a state of each layer L of the memory unit MU0 under the same conditions as in FIG. 11. As shown in FIG. 12, when the word line WL(0,0) and the vertical bit line VBL0 are selected, the cell transistor CT of each of the four memory cells MC(0,0) sharing the word line WL(0,0) and the four bit line select transistors BS0 sharing the vertical bit line VBL0 are turned on. Accordingly, a voltage based on the charge accumulated in the cell capacitor CC of the memory cell MC(0,0) of the layer L1 is transferred to the global bit line GBL1 via the bit line BL0 and the bit line select transistor BS0 of the layer L1. A voltage based on the charge accumulated in the cell capacitor CC of the memory cell MC(0,0) of the layer L2 is transferred to the global bit line GBL2 via the bit line BL0 and the bit line select transistor BS0 of the layer L2. A voltage based on the charge accumulated in the cell capacitor CC of the memory cell MC(0,0) of the layer L3 is transferred to the global bit line GBL3 via the bit line BL0 and the bit line select transistor BS0 of the layer L3. Similarly, when a memory cell MC other than the memory cell MC(0,0) is selected, a set of the word line WL and the bit line select transistor BS to be selected is changed, so that a voltage based on the data stored in the memory cell MC selected in each layer L may be reflected in each global bit line GBL.

Figure 13:
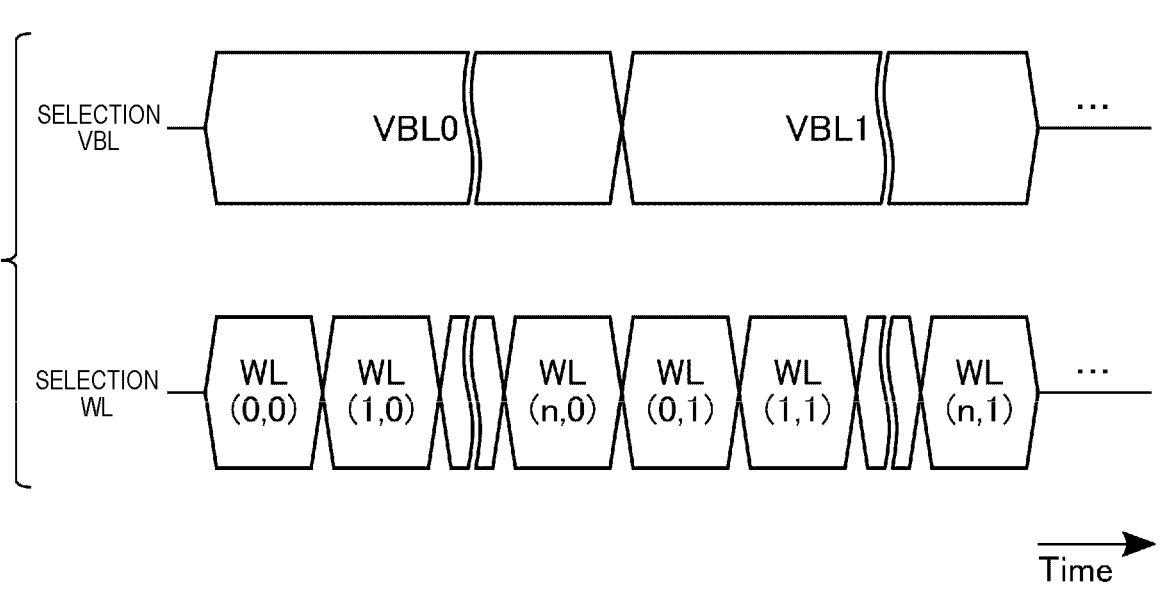
FIG. 13 is a timing chart showing a read operation of the memory device according to the first embodiment.

FIG. 13 is a timing chart showing a read operation of the memory device 100 according to the first embodiment. FIG. 13 illustrates the vertical bit line VBL and the word line WL which are selected when all the memory cells MC in the subarray 111 are successively read. As shown in FIG. 13, the control circuit 160 first executes reading in which the word lines WL in the memory unit MU0 associated with the vertical bit line VBL0 are sequentially selected in a state where the vertical bit line VBL0 is selected. Specifically, the control circuit 160 selects the vertical bit line VBL0 and selects the word lines WL(0,0), WL(1,0), . . . , and WL(n,0) in this order to execute data reading. Next, the control circuit 160 executes reading in which the word lines WL in the memory unit MU1 associated with the vertical bit line VBL1 are sequentially selected in a state where the vertical bit line VBL1 is selected. Specifically, the control circuit 160 selects the vertical bit line VBL1 and selects the word lines WL(0, 1), WL(1,1), . . . , and WL(n,1) in this order to execute data reading. Thereafter, similarly, the control circuit 160 executes reading in which the vertical bit line VBL to be selected is changed and reading in which the word lines WL associated with the changed selection VBL are sequentially selected. The order of the read operation may be any other order. The order in which the control circuit 160 executes the read operation may be changed as appropriate depending on the address of the data requested by the memory controller 200.

<1-3> Effects of First Embodiment

With the memory device 100 according to the first embodiment, a manufacturing cost of the memory device 100 can be reduced. Hereinafter, details of the effects of the first embodiment will be described.

In a DRAM including the three-dimensionally stacked memory cells MC (hereinafter, referred to as "3D-DRAM"), when the sense amplifier SA is provided for each bit line BL, the number of the sense amplifiers SA increases as the arrangement density of the memory cells MC increases. When the number of the sense amplifiers SA increases, a chip area increases. The increase in chip area causes an increase in manufacturing cost of the memory device.

Therefore, the memory device 100 according to the first embodiment has a configuration in which one sense amplifier SA is shared by the plurality of bit lines BL. Specifically, the subarray 111 in the memory device 100 according to the first embodiment has the global bit line GBL for each layer L. The sense amplifier SA is provided for each global bit line GBL. In addition, the subarray 111 includes the plurality of bit line select transistors BS that connect the global bit line GBL and the plurality of bit lines BL for each layer.

More specifically, in the memory device 100 according to the first embodiment, the plurality of memory cells MC are provided for each of the plurality of layers L arranged in the Z direction. The plurality of memory cells in each layer L are classified into the plurality of memory units MU each including the plurality of memory cells MC arranged in the X direction and arranged in the Y direction. The plurality of bit lines BL are provided for each of the plurality of layers L and are arranged in the Y direction. Each of the plurality of bit lines BL is connected to the plurality of memory cells provided in any of the plurality of memory units MU in the same layer L. The plurality of bit line select transistors BS are provided for each of the plurality of layers L, and are respectively connected to the plurality of bit lines BL in the same layer L. The global bit line GBL is provided for each of the plurality of layers L, and is connected to each of the plurality of bit lines BL in the same layer via each of the plurality of bit line select transistors BS in the same layer. The plurality of word lines each extend in the Z direction and are connected to the plurality of memory cells MC of each of the plurality of layers L. The plurality of vertical bit lines VBL each extend in the Z direction and are connected to the plurality of bit line select transistors BS of each of the plurality of layers L. In addition, the plurality of sense amplifiers SA are provided, each of which is connected to the global bit line GBL of each of the plurality of layers L.

In the memory device 100 configured as described above, the global bit line GBL and any of the plurality of bit lines BL may be selectively connected for each layer. That is, in the memory device 100 according to the first embodiment, one sense amplifier SA may be shared for each layer L. As a result, in the memory device 100 according to the first embodiment, the number of the sense amplifiers SA can be reduced, and the chip area can be reduced. That is, the memory device 100 according to the first embodiment can reduce the manufacturing cost of the memory device.

In the first embodiment, a case in which the sense amplifier SA is shared for each layer L, that is, the sense amplifier SA is shared by the bit lines BL arranged in the Y direction is described as an example, but the present disclosure is not limited thereto. The sense amplifier SA may be shared by a set of the bit lines BL stacked in the Z direction. In this case, the sense amplifier SA is provided according to the number of the bit lines BL arranged in the Y direction. On the other hand, in the 3D-DRAM, the number of the bit lines BL arranged in the Y direction is larger than the number of the stacked bit lines BL. Therefore, from the viewpoint of reducing the number of the sense amplifiers SA, it is preferable that a set of the bit lines BL sharing the sense amplifier SA be arranged in the Y direction rather than being stacked in the Z direction.

<2> Second Embodiment

The memory device 100 according to a second embodiment has a configuration in which two subarrays 111 adjacent to each other share the sense circuit 133 for each layer. Hereinafter, details of the memory device 100 according to the second embodiment will be described, mainly focusing on points different from those of the first embodiment.

<2-1> Configuration

First, a configuration of the memory device 100 according to the second embodiment will be described.

<2-1-1> Planar Layout of Memory Device 100

Figure 14:
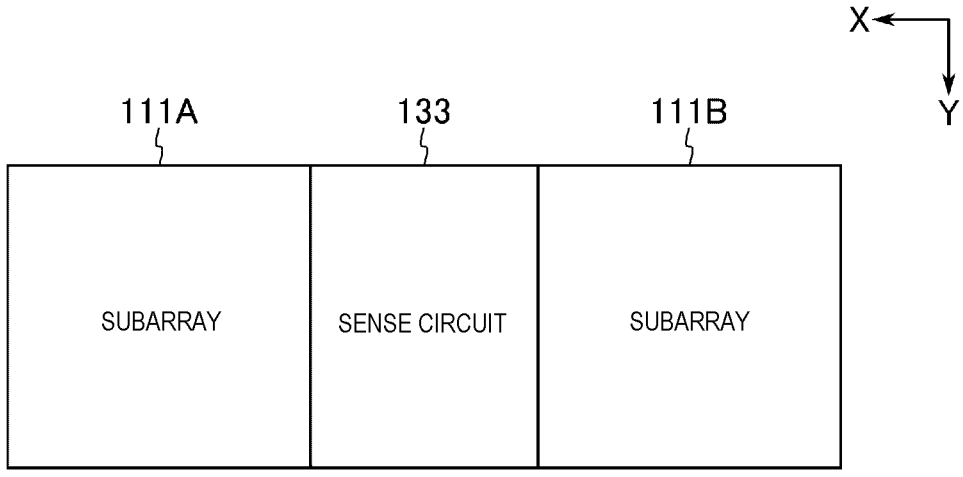
FIG. 14 is a plan view showing a planar layout of a memory device according to a second embodiment.

FIG. 14 is a plan view showing a planar layout of the memory device 100 according to the second embodiment.

As shown in FIG. 14, the memory device 100 according to the second embodiment has subarrays 111A and 111B. In the second embodiment, the sense circuit 133 is disposed between the subarrays 111A and 111B. In other words, the subarray 111A, the sense circuit 133, and the subarray 111B are arranged side by side in the X direction. The sense circuit 133 of the second embodiment is configured with an Open-BL method. Accordingly, the sense circuit 133 of the second embodiment is configured to read data using a voltage of the bit line BL of the subarray 111A and a voltage of the bit line BL of the subarray 111B.

<2-1-2> Connection Relationship Between Subarrays 111A and 111B and Sense Circuit 133

Figure 15:
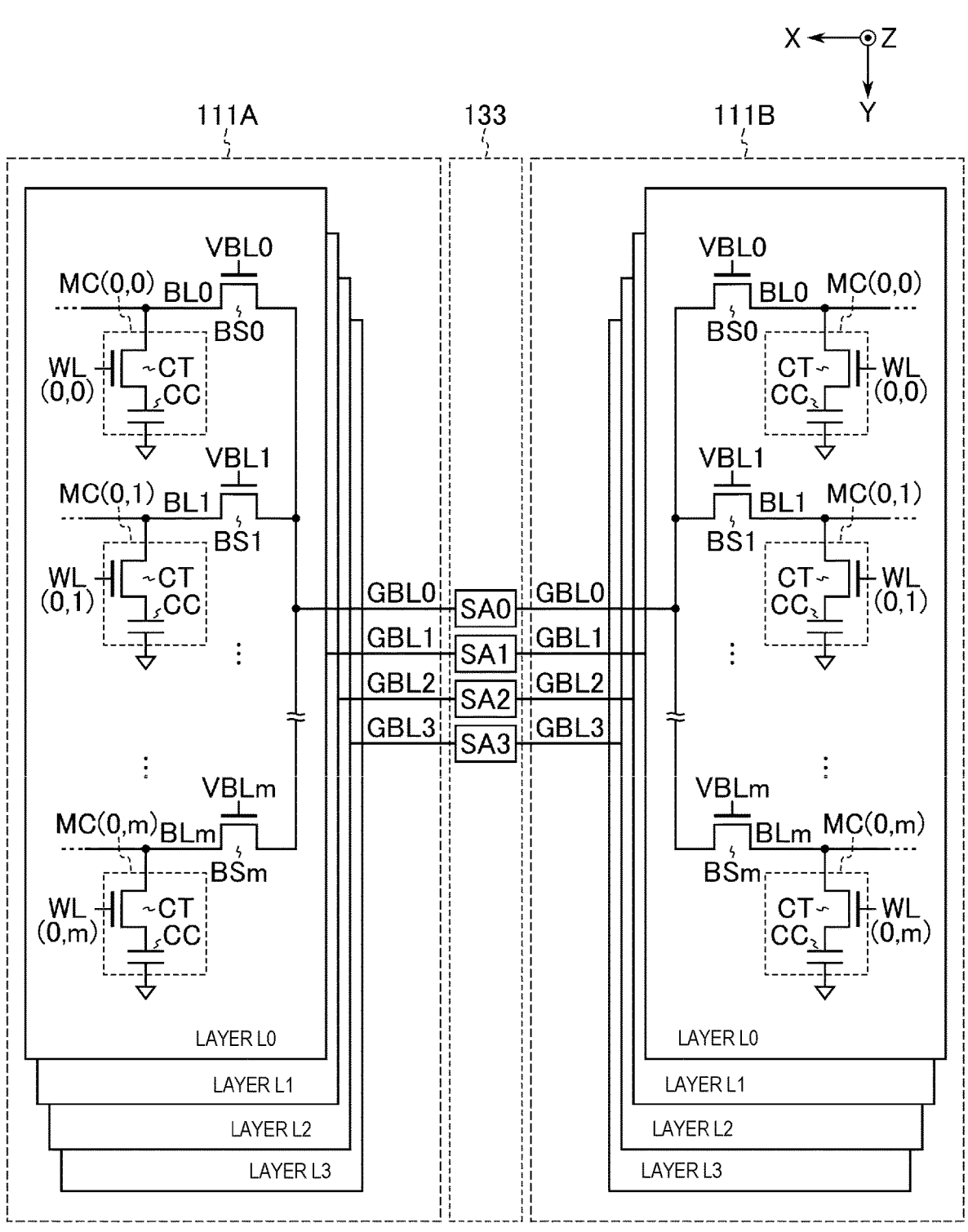
FIG. 15 is a circuit diagram showing a connection relationship between each layer of subarrays and the sense circuit in the memory device according to the second embodiment.

FIG. 15 is a circuit diagram showing a connection relationship between each layer of the subarrays 111A and 111B and the sense circuit 133 in the memory device 100 according to the second embodiment. As shown in FIG. 15, a circuit configuration of the subarray 111A is the same as that of the subarray 111 of the first embodiment. In addition, the subarray 111B has a circuit configuration symmetric with respect to the subarray 111A. The global bit lines GBL0 to GBL3 of the subarray 111A are provided on the sense circuit 133 side. Similarly, the global bit lines GBL0 to GBL3 of the subarray 111B are provided on the sense circuit 133 side. In the following, coordinates (i, j) of the subarray 111B will be described as coordinates obtained by inverting coordinates of the subarray 111A in the X direction.

The global bit line GBL0 of each of the subarrays 111A and 111B is connected to the sense amplifier SA0 in the sense circuit 133. The global bit line GBL1 of each of the subarrays 111A and 111B is connected to the sense amplifier SA1 in the sense circuit 133. The global bit line GBL2 of each of the subarrays 111A and 111B is connected to the sense amplifier SA2 in the sense circuit 133. The global bit line GBL3 of each of the subarrays 111A and 111B is connected to the sense amplifier SA3 in the sense circuit 133.

The sense amplifier SA0 of the second embodiment is configured to perform reading by the Open-BL method based on a voltage of the global bit line GBL0 of each of the subarrays 111A and 111B. The sense amplifier SA1 of the second embodiment is configured to perform reading by the Open-BL method based on a voltage of the global bit line GBL1 of each of the subarrays 111A and 111B. Hereinafter, each sense amplifier SA of the second embodiment is configured to perform reading by the Open-BL method based on voltages of two correlated global bit lines GBL in the subarrays 111A and 111B.

Other configurations of the memory device 100 according to the second embodiment are the same as those of the first embodiment. In the above description, a case in which each sense amplifier SA is connected to two global bit lines GBL correlated with the same layer L between the subarrays 111A and 111B is described as an example, but the present disclosure is not limited thereto. The sense amplifier SA of the second embodiment need only be connected to any global bit line GBL of the subarray 111A and any global bit line GBL of the subarray 111B. That is, the sense amplifier SA of the second embodiment may be connected to two global bit lines GBL correlated with different layers L between the subarrays 111A and 111B.

<2-2> Operation

Next, the operation of the memory device 100 according to the second embodiment will be described. In the memory device 100 according to the second embodiment, when the memory cell MC of one subarray 111 of the subarrays 111A and 111B is selected for the reading using the Open-BL method, the bit line BL of the other subarray 111 is used as a reference bit line. In other words, the sense amplifier SA of the second embodiment is configured to use one global bit line GBL of the global bit line GBL of the subarray 111A and the global bit line GBL of the subarray 111B as a reference line and amplify a voltage of the other global bit line GBL.

Figure 16:
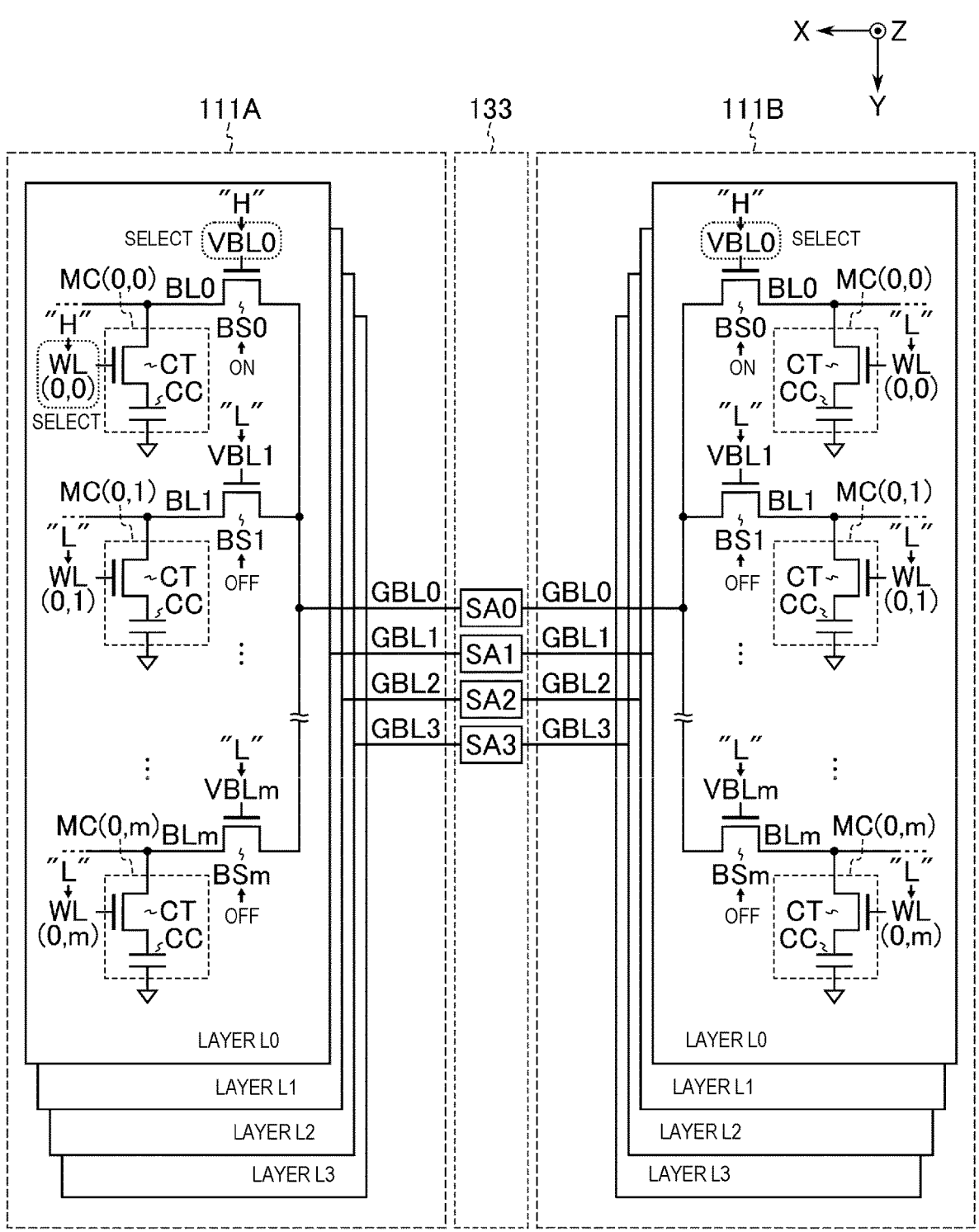
FIG. 16 is a schematic view for explaining a method of selecting a memory cell with focusing on one layer of the subarrays in the memory device according to the second embodiment.

FIG. 16 is a schematic view for explaining a method of selecting a memory cell MC with focusing on one layer (L0) of the subarrays 111A and 111B in the memory device 100 according to the second embodiment. FIG. 16 shows examples of a voltage and the like applied to each wiring when data stored in the memory cell MC(0,0) of the subarray 111A is read. As shown in FIG. 16, when reading the data stored in the memory cell MC(0,0) of the subarray 111A, the word line WL(0,0) and the vertical bit line VBL0 of the subarray 111A are selected. In addition, in order to perform the reading using the Open-BL method, the vertical bit line VBL0 of the subarray 111B is also selected, which is correlated with the vertical bit line VBL0 of the subarray 111A. In the read operation, a voltage of an "H" level is applied to the selected wiring, and a voltage of an "L" level is applied to the non-selected wiring.

As a result, the bit line select transistor BS0 of each layer L of the subarray 111A is turned on, and the other bit line select transistors BS of each layer L of the subarray 111A are turned off. Similarly, the bit line select transistor BS0 of each layer L of the subarray 111B is turned on, and the other bit line select transistors BS of each layer L of the subarray 111B are turned off. Then, the cell transistor CT of the memory cell MC(0,0) of the subarray 111A is turned on, and the cell transistors CT of the other memory cells MC of the subarray 111A are turned off. On the other hand, the cell transistor CT of each memory cell MC of the subarray 111B is maintained in an off state.

As a result, each sense amplifier SA may amplify the voltage based on the charge accumulated by the cell capacitor CC of the memory cell MC(0,0) of the subarray 111A by using a pair of the global bit lines GBL between the subarrays 111A and 111B. The read/write circuit 140 may determine the data stored in the memory cell MC(0,0) based on the amplified voltage.

In addition, in the memory device 100 according to the second embodiment, even when a memory cell MC other than the memory cell MC(0,0) in the memory unit MU0 is selected, the data may be read in the same manner as the memory cell MC(0,0) by changing the word line WL to be selected. In addition, in the memory device 100 according to the second embodiment, even when a memory cell MC of the memory unit MU other than the memory unit MU0 is selected, the data may be read in the same manner as the memory unit MU0 by changing the set of vertical bit lines VBL to be selected in the subarrays 111A and 111B.

<2-3> Effects of Second Embodiment

The memory device 100 according to the second embodiment can achieve the same effects as those of the first embodiment. Further, in the memory device 100 according to the second embodiment, the sense amplifier SA is shared between the two subarrays 111A and 111B. As a result, the memory device 100 according to the second embodiment can reduce the chip area and can execute the read operation using the Open-BL method.

<3> Third Embodiment

The memory device 100 according to a third embodiment has a configuration in which the bit line select transistors BS are distributed to the left and right for each layer. Hereinafter, details of the memory device 100 according to the third embodiment will be described, mainly focusing on points different from those of the first and second embodiments.

<3-1> Configuration

First, a configuration of the memory device 100 according to the third embodiment will be described.

<3-1-1> Planar Layout of Memory Device 100

Figure 17:
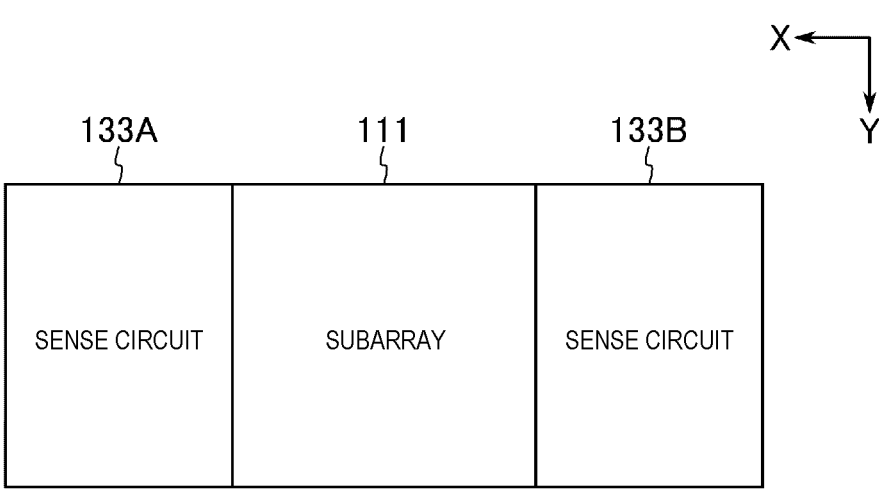
FIG. 17 is a plan view showing a planar layout of a memory device according to a third embodiment.

FIG. 17 is a plan view showing a planar layout of the memory device 100 according to the third embodiment. As shown in FIG. 17, the memory device 100 according to the third embodiment has sense circuits 133A and 133B. In the third embodiment, the subarray 111 is disposed between the sense circuits 133A and 133B. In other words, the sense circuit 133A, the subarray 111, and the sense circuit 133B are arranged side by side in the X direction. In the second embodiment, the set of sense circuits 133A and 133B has the same configuration as the sense circuit 133 of the first embodiment.

Figure 18:
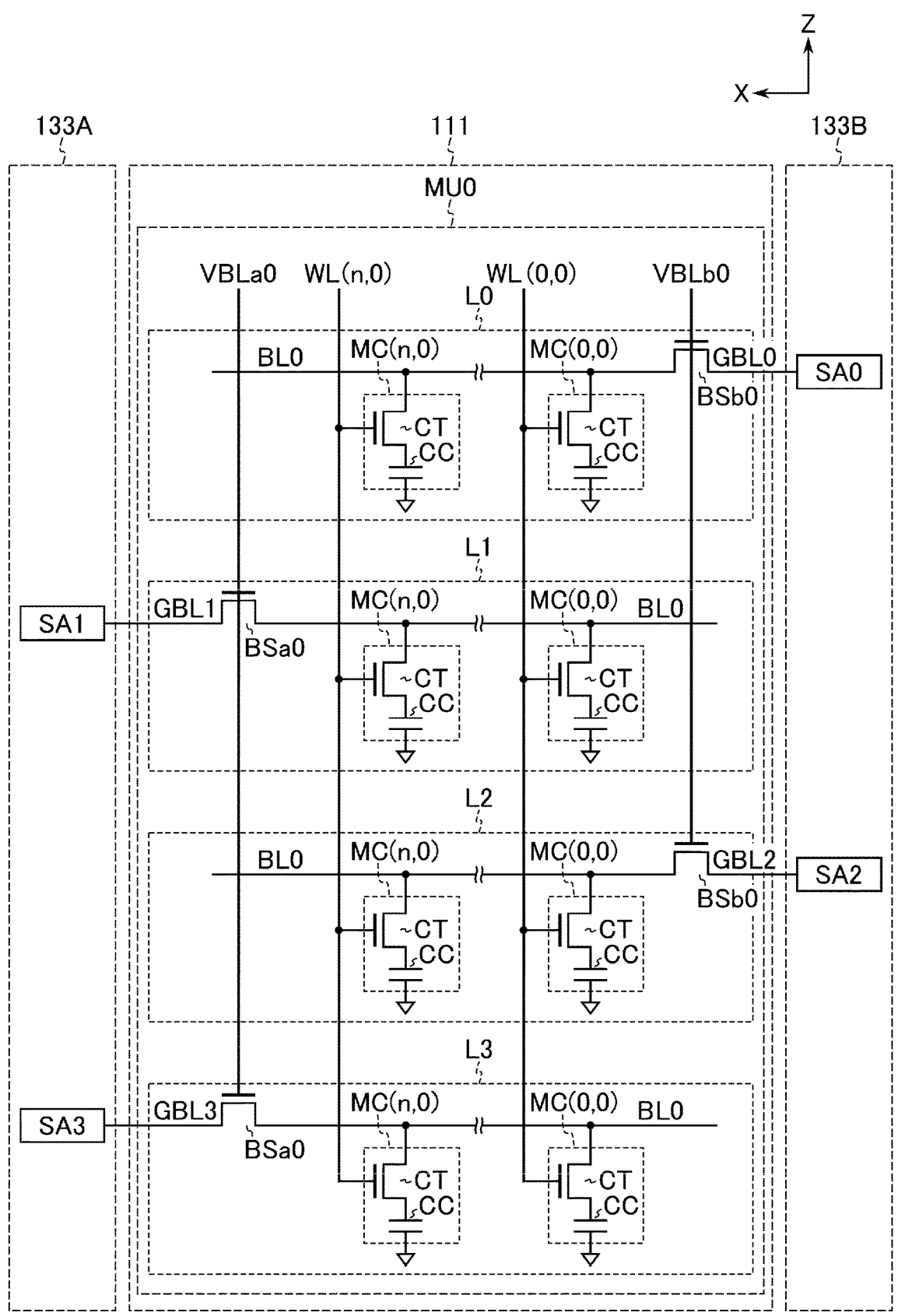
FIG. 18 is a circuit diagram showing a connection relationship between one memory unit in the subarray and the sense circuits in the memory device according to the third embodiment.

<3-1-2> Connection Relationship Between Subarray 111 and Sense Circuits 133A and 133B FIG. 18 is a circuit diagram showing a connection relationship between one memory unit (MU0) provided in the subarray 111 and the sense circuits 133A and 133B in the memory device 100 according to the third embodiment. As shown in FIG. 18, the memory unit MU0 of the subarray 111 of the third embodiment has two bit line select transistors BSa0 disposed on the sense circuit 133A side and two bit line select transistors BSb0 disposed on the sense circuit 133B side, instead of the bit line select transistor BS of each layer L. Further, the subarray 111 of the third embodiment has a vertical bit line VBLa disposed on the sense circuit 133A side and a vertical bit line VBLb disposed on the sense circuit 133B side for each memory unit MU. In addition, the sense circuit 133A of the third embodiment includes sense amplifiers SA1 and SA3. The sense circuit 133B of the third embodiment includes sense amplifiers SA0 and SA2.

Specifically, the bit line select transistors BSa0 and BSb0 are alternately arranged in each layer L. For example, the two bit line select transistors BSA0 are assigned to the layers L1 and L3, respectively. The two bit line select transistors BSb0 are assigned to the layers L0 and L2, respectively. The bit line select transistor BSb0 of the layer L0 is connected to the sense amplifier SA0 of the sense circuit 133B via the global bit line GBL0. The bit line select transistor BSa0 of the layer L1 is connected to the sense amplifier SA1 of the sense circuit 133A via the global bit line GBL1. The bit line select transistor BSb0 of the layer L2 is connected to the sense amplifier SA2 of the sense circuit 133B via the global bit line GBL2. The bit line select transistor BSa0 of the layer L3 is connected to the sense amplifier SA3 of the sense circuit 133A via the global bit line GBL3. The memory unit MU0 includes vertical bit lines VBLa0 and VBLb0. The vertical bit line VBLa0 is connected to a gate end of each of the two bit line select transistors BSa0. The vertical bit line VBLb0 is connected to a gate end of each of the two bit line select transistors BSb0.

The other memory units MU (not shown) have two bit line select transistors BSa disposed on the sense circuit 133A side and two bit line select transistors BSb disposed on the sense circuit 133B side, as with the memory unit MU0. The bit line select transistor BSa of each memory unit MU is connected to the global bit line GBL correlated with the same layer L on the sense circuit 133A side. The bit line select transistor BSb of each memory unit MU is connected to the global bit line GBL correlated with the same layer L on the sense circuit 133B side.

As described above, the sense circuit 133A of the third embodiment includes the plurality of sense amplifiers SA connected to the global bit lines GBL of the odd-numbered layers L. The sense circuit 133B of the third embodiment includes the plurality of sense amplifiers SA connected to the global bit lines GBL of the even-numbered layers L. The two vertical bit lines VBLa and VBLb assigned to the same memory unit MU may be electrically connected to each other when controlled at the same voltage.

<3-1-3> Cross-Sectional Structure of End Region EA

Figure 19:
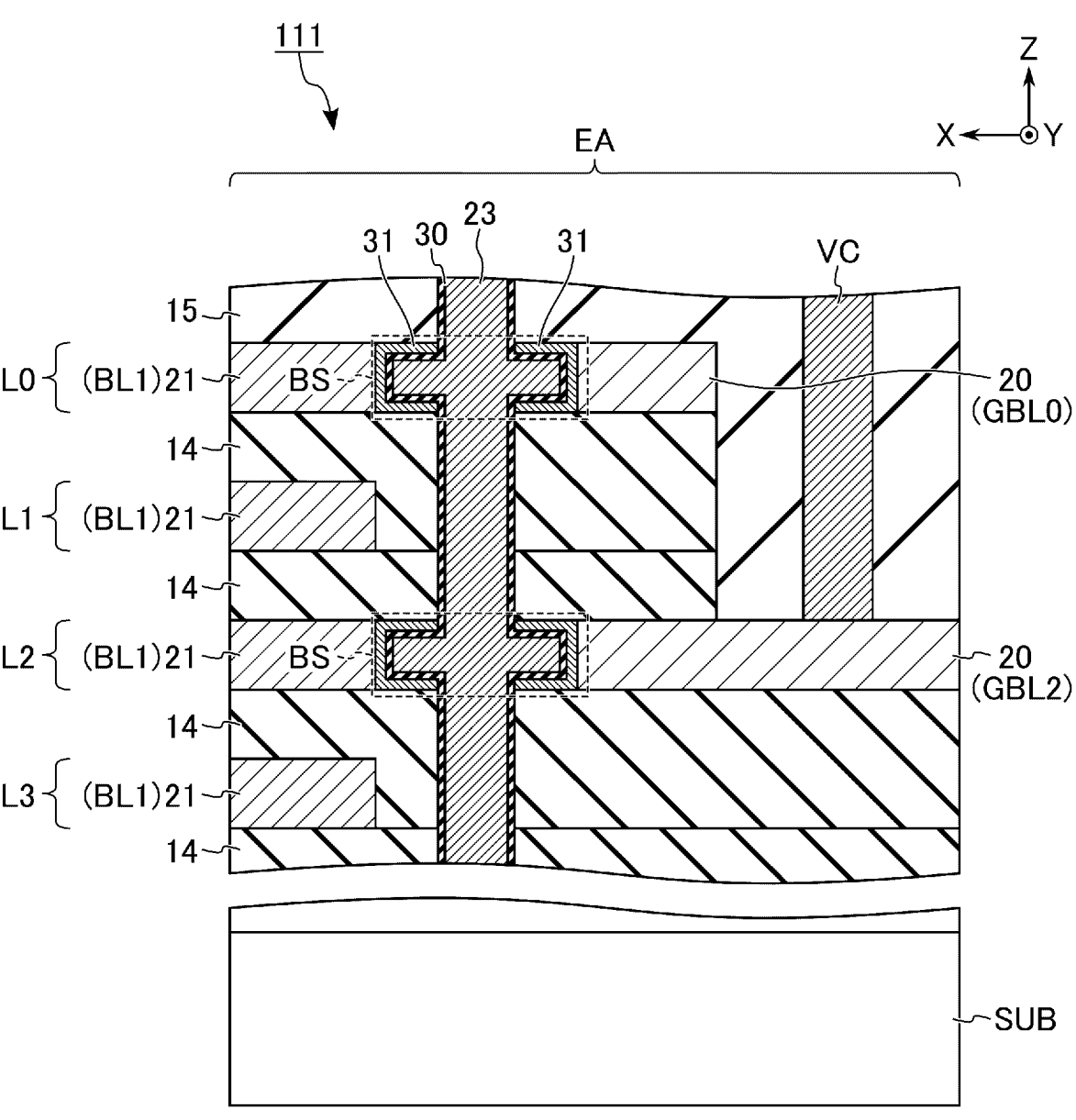
FIG. 19 is a cross-sectional view showing a cross-sectional structure in an end region of the subarray in the memory device according to the third embodiment.

FIG. 19 is a cross-sectional view showing a cross-sectional structure in an end region EA of the memory unit MU1 in the subarray 111 of the memory device 100 according to the third embodiment. FIG. 19 shows a cross section including the global bit lines GBL0 and GBL2 respectively correlated with the layers L0 and L2 on the sense circuit 133B side. As shown in FIG. 19, the subarray 111 of the third embodiment has a configuration in which two conductor layers 20 corresponding to the global bit lines GBL1 and GBL3 are omitted with respect to the subarray 111 described with reference to FIG. 7 in the first embodiment. On the other hand, although not shown, the subarray 111 of the third embodiment has a configuration in which two conductor layers 20 corresponding to the global bit lines GBL0 and GBL2 are omitted with respect to the subarray 111 described with reference to FIG. 7 in the first embodiment, on the sense circuit 133A side, the configuration being inverted in the X direction.

In the end region EA on the sense circuit 133B side shown in FIG. 19, the structure corresponding to the bit line select transistor BS of each of the layers L1 and L3 in the first embodiment (i.e., the semiconductor layer 31 or the thick portion of the conductor layer 23 facing the conductor layers 20 and 21) is omitted. In addition, the conductor layer 21 of each of the layers L1 and L3 and the insulator layer 30 used in the bit line select transistor BSb are separated from each other.

On the other hand, in the end region on the sense circuit 133A side (not shown), the structure corresponding to the bit line select transistor BS of each of the layers L0 and L2 in the first embodiment (i.e., the semiconductor layer 31 or the thick portion of the conductor layer 23 facing the conductor layers 20 and 21) is omitted. In addition, the conductor layer 21 of each of the layers L0 and L2 and the insulator layer 30 used in the bit line select transistor BSa are separated from each other.

As described above, in the memory device 100 according to the third embodiment, the conductor layer 20 is not provided between two global bit lines GBL provided in the even-numbered layers L and adjacent to each other. Similarly, the conductor layer 20 is not provided between two global bit lines GBL provided in the odd-numbered layers L and adjacent to each other. Other configurations of the memory device 100 according to the third embodiment are the same as those of the first embodiment.

In the above description, a case in which the odd-numbered global bit line GBL is connected to the sense circuit 133A and the even-numbered global bit line GBL is connected to the sense circuit 133B is described as an example, but the present disclosure is not limited thereto. In the third embodiment, the bit line select transistors BS need only be alternately arranged on the left and right (that is, on the sense circuit 133A side and the sense circuit 133B side) for each layer L. In addition, the conductor layers 20 adjacent to each other in the Z direction need only be disposed apart from each other via at least one layer L.

<3-2> Operation

Next, the operation of the memory device 100 according to the third embodiment will be described.

Figure 20:
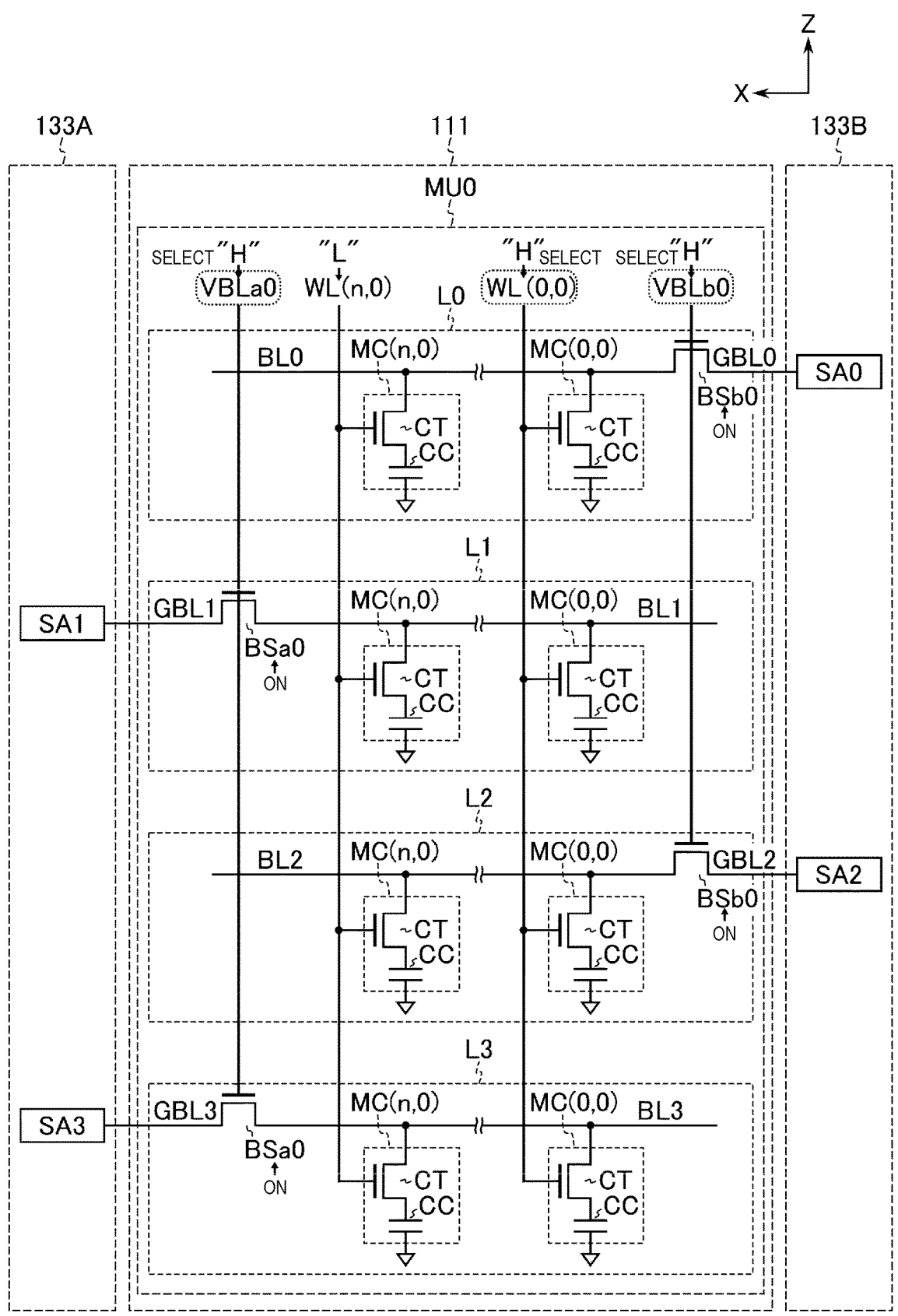
FIG. 20 is a schematic view for explaining a method of selecting a memory cell with focusing on one memory unit in the subarray of the memory device according to the third embodiment.

FIG. 20 is a schematic view for explaining a method of selecting a memory cell MC with focusing on one memory unit (MU0) in the subarray 111 of the memory device 100 according to the third embodiment. FIG. 20 shows examples of a voltage and the like applied to each wiring when data stored in the memory cell MC(0,0) of the subarray 111 is read. As shown in FIG. 20, when reading the data stored in the memory cell MC(0,0), the word line WL(0,0), the vertical bit line VBLa0, and the vertical bit line VBLb0 are selected. That is, a voltage of an "H" level is applied to the selected wiring, and a voltage of an "L" level is applied to the non-selected wiring.

As a result, in the subarray 111, the bit line select transistor BSa0 of each of the layers L1 and L3 and the bit line select transistor BSb0 of each of the layers L0 and L2 are turned on, and the other bit line select transistors BSa and BSb of each layer L are turned off. Then, the cell transistor CT of the memory cell MC(0,0) of each layer L of the subarray 111 is turned on, and the cell transistors CT of the other memory cells MC of the subarray 111 are turned off.

As a result, the even-numbered sense amplifier SA may amplify the voltage based on the charge accumulated by the cell capacitor CC of the memory cell MC(0,0) connected via the associated global bit line GBL on the sense circuit 133B side. Similarly, the odd-numbered sense amplifier SA may amplify the voltage based on the charge accumulated by the cell capacitor CC of the memory cell MC(0,0) connected via the associated global bit line GBL on the sense circuit 133A side. The read/write circuit 140 may determine the data stored in the memory cell MC(0,0) of each layer L based on the voltages amplified by the sense circuits 133A and 133B.

In the memory device 100 according to the third embodiment, even when a memory cell MC other than the memory cell MC(0,0) in the memory unit MU0 is selected, the data may be read in the same manner as the memory cell MC(0,0) by changing the word line WL to be selected. In addition, in the memory device 100 according to the third embodiment, even when a memory cell MC of the memory unit MU other than the memory unit MU0 is selected, the data may be read in the same manner as the memory unit MU0 by changing the set of vertical bit lines VBLa and VBLb to be selected.

In the memory device 100 according to the third embodiment, when the vertical bit lines VBLa and VBLb are separately controlled, the memory cell MC correlated with the sense circuit 133A and the memory cell MC correlated with the sense circuit 133B may be read simultaneously, or only one of them may be read.

<3-3> Effects of Third Embodiment

The memory device 100 according to the third embodiment can achieve the same effects as those of the first embodiment. Further, in the memory device 100 according to the third embodiment, the bit line select transistors BS are distributed to the left and right for each layer L. In the memory device 100 according to the third embodiment, an interval between the global bit lines GBL adjacent to each other in the Z direction is wider than that in the first embodiment. As a result, the memory device 100 according to the third embodiment can reduce the interlayer capacitance of the bit line select transistor BS and can reduce power consumption more than in the first embodiment.

<4> Fourth Embodiment

The memory device 100 according to a fourth embodiment has a configuration in which a plurality of sense amplifiers SA are disposed in the same layer. Hereinafter, details of the memory device 100 according to the fourth embodiment will be described, mainly focusing on points different from those of the first to third embodiments.

<4-1> Configuration

First, configurations of the memory device 100 according to the fourth embodiment will be described. Hereinafter, as the configurations of the memory device 100 according to the fourth embodiment, a first configuration example, a second configuration example, and a third configuration example will be described in order.

1: First Configuration Example

In the first configuration example of the memory device 100 according to the fourth embodiment, the sense circuit 133A, the subarray 111, and the sense circuit 133B are arranged side by side in the X direction as in the third embodiment. In addition, in the first configuration example, unlike the first embodiment, a plurality of sense amplifiers SA are assigned to each layer L.

Figure 21:
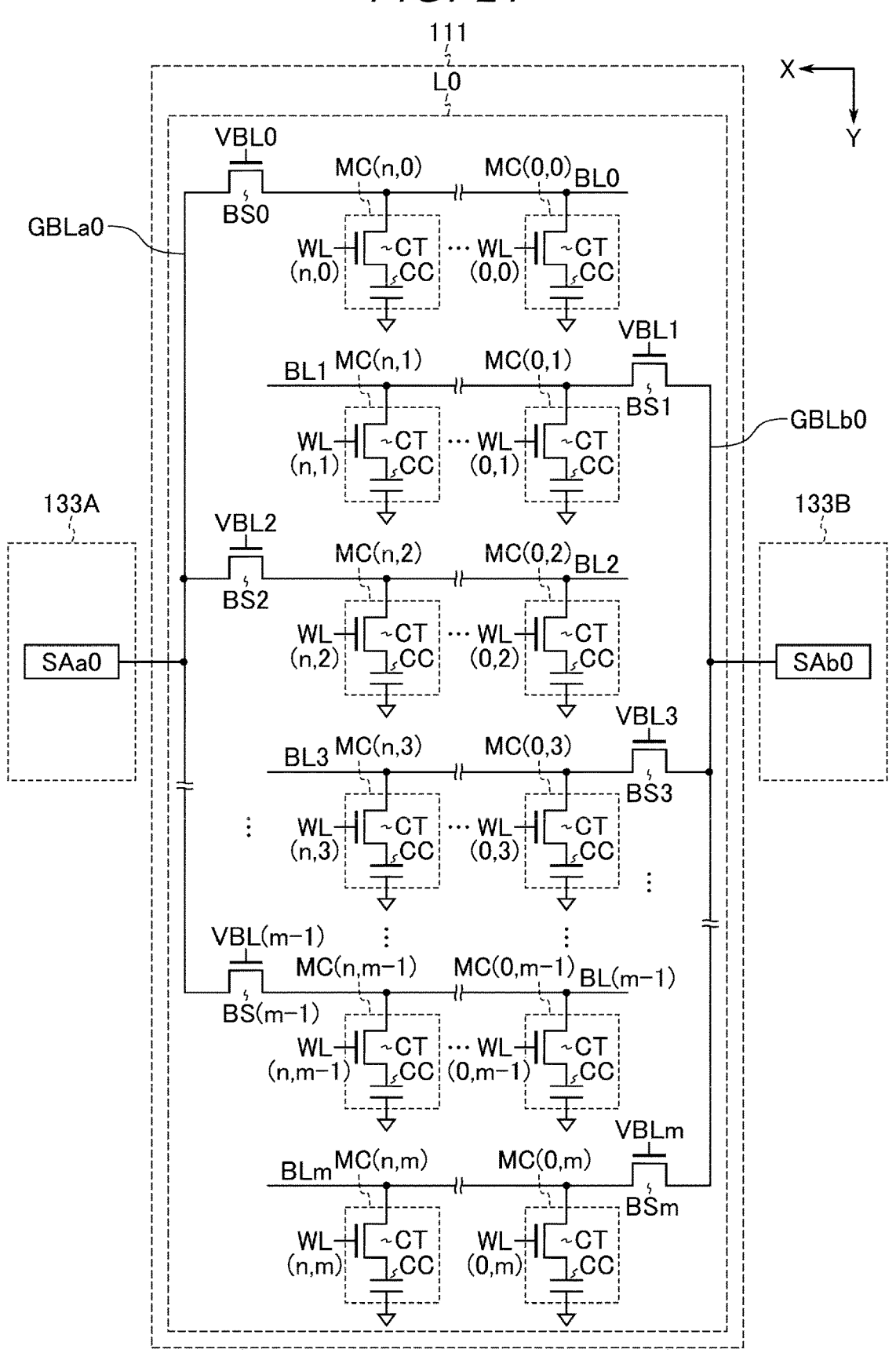
FIG. 21 is a circuit diagram showing a connection relationship between one layer in a subarray and sense circuits in a first configuration example of a memory device according to a fourth embodiment.

FIG. 21 is a circuit diagram showing a connection relationship between one layer (L0) in the subarray 111 and the sense circuits 133A and 133B in the first configuration example of the memory device 100 according to the fourth embodiment. As shown in FIG. 21, the subarray 111 of the first configuration example has a circuit configuration in which the arrangement of the bit line select transistor BS and the global bit line GBL is different from that of the subarray 111 of the first embodiment. Hereinafter, the global bit line GBL on the sense circuit 133A side is referred to as a "global bit line GBLa". The global bit line GBL on the sense circuit 133B side is referred to as a "global bit line GBLb". For example, the subarray 111 of the first configuration example has global bit lines GBLa0 and GBLb0 corresponding to the layer L0. In addition, although not shown, the subarray 111 of the first configuration example has global bit lines GBLa1 to GBLa3 and global bit lines GBLb1 to GBLb3 corresponding to the layers L1 to L3.

In the layer L0, the even-numbered bit line select transistors BS are connected to the correlated bit lines BL and global bit line GBLa0 on the sense circuit 133A side. In addition, in the layer L0, the odd-numbered bit line select transistors BS are connected to the correlated bit lines BL and global bit line GBLb0 on the sense circuit 133B side. In addition, although not shown, in the layer L1, as in the layer L0, the even-numbered bit line select transistors BS are connected to the correlated bit lines BL and global bit line GBLa1, and the odd-numbered bit line select transistors BS are connected to the correlated bit lines BL and global bit line GBLb1. The bit line select transistor BS and the global bit lines GBLa and GBLb of the other layers L also have a connection relationship similar to that of the layers L0 and L1.

In addition, the sense circuit 133A of the first configuration example has the sense amplifiers SAa whose number corresponds to the number of the layers L. The sense circuit 133B of the first configuration example has the sense amplifiers SAb whose number corresponds to the number of the layers L. Specifically, the sense circuit 133A of the first configuration example has sense amplifiers SAa0 to SAa3 corresponding to the layers L0 to L3 (a part of which is not shown). The sense circuit 133B of the first configuration example has sense amplifiers SAb0 to SAb3 corresponding to the layers L0 to L3 (a part of which is not shown).

The sense amplifiers SAa0 and SAb0 are respectively connected to the global bit lines GBLa0 and GBLb0 associated with the layer L0. The sense amplifiers SAa1 and SAb1 are respectively connected to the global bit lines GBLa1 and GBLb1 associated with the layer L1 (not shown). The sense amplifiers SAa2 and SAb2 are respectively connected to the global bit lines GBLa2 and GBLb2 associated with the layer L2 (not shown). The sense amplifiers SAa3 and SAb3 are respectively connected to the global bit lines GBLa3 and GBLb3 associated with the layer L3 (not shown).

As described above, in the first configuration example of the memory device 100 according to the fourth embodiment, the global bit line GBLa is connected to the bit line select transistors BS connected to the even-numbered bit lines BL among the plurality of bit lines BL in the same layer L. The global bit line GBLb is connected to the bit line select transistors BS connected to the odd-numbered bit lines among the plurality of bit lines BL in the same layer L. Other configurations of the subarray 111 and the sense circuits 133A and 133B of the first configuration example are the same as those of the first embodiment.

In the above description, in the first configuration example, a case in which the global bit line GBLa is connected to the even-numbered bit line select transistors BS and the global bit line GBLb is connected to the odd-numbered bit line select transistors BS is described, but the present disclosure is not limited thereto. The subarray 111 of the first configuration example need only have a configuration including each of the bit line select transistor BS connected to the sense circuit 133A and the bit line select transistor BS connected to the sense circuit 133B.

2: Second Configuration Example

In the second configuration example of the memory device 100 according to the fourth embodiment, the subarray 111 and the sense circuit 133 are arranged side by side in the X direction as in the first embodiment. In addition, in the second configuration example, a plurality of sense amplifiers SA are assigned to each layer L.

Figure 22:
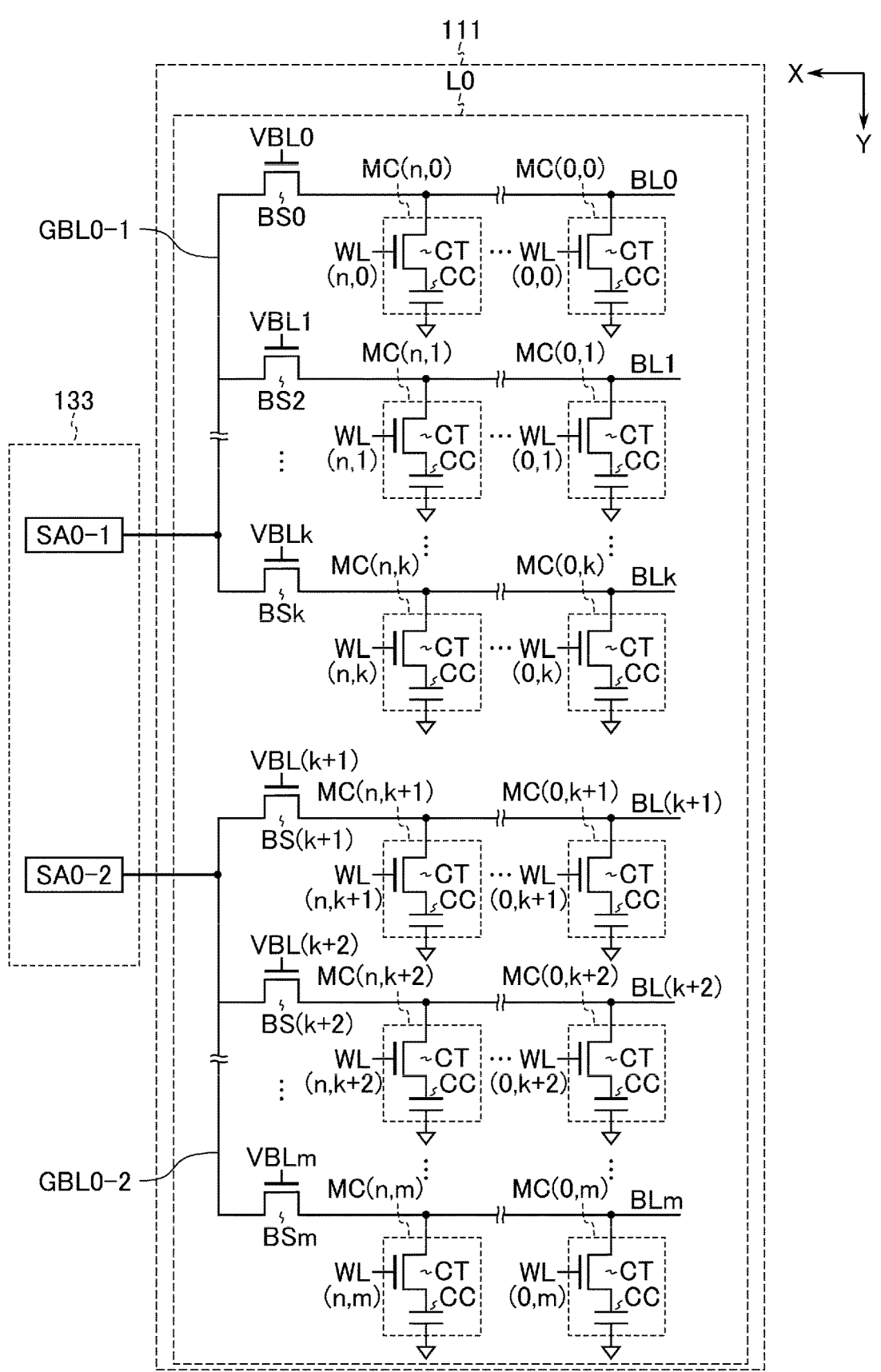
FIG. 22 is a circuit diagram showing a connection relationship between one layer in the subarray and sense circuits in a second configuration example of the memory device according to the fourth embodiment.

FIG. 22 is a circuit diagram showing a connection relationship between one layer (L0) in the subarray 111 and the sense circuits 133A and 133B in the second configuration example of the memory device 100 according to the fourth embodiment. As shown in FIG. 22, the subarray 111 of the second configuration example has a circuit configuration in which the global bit line GBL is divided into a plurality of pieces for each layer L with respect to the subarray 111 of the first embodiment. Hereinafter, a case in which the global bit line GBL is divided into two for each layer L will be described. The global bit lines GBL0 divided into two are referred to as global bit lines GBL0-1 and GBL0-2. The global bit lines GBL1 divided into two are referred to as global bit lines GBL1-1 and GBL1-2. The global bit lines GBL2 divided into two are referred to as global bit lines GBL2-1 and GBL2-2. The global bit lines GBL3 divided into two are referred to as global bit lines GBL3-1 and GBL3-2.

In the layer L0, the bit line select transistors BS0 to BSk (k is an integer equal to or more than 2 and less than m) are connected to the correlated bit lines BL and global bit line GBL0-1. "k" is preferably a numerical value close to (m+1)/2. In the layer L0, the bit line select transistors BS(k+1) to BSm are connected to the correlated bit lines BL and global bit line GBL0-2. In addition, although not shown, in the layer L1, the bit line select transistors BS0 to BSk are connected to the correlated bit lines BL and global bit line GBL1-1, and the bit line select transistors BS(k+1) to BSm are connected to the correlated bit lines BL and global bit line GBL1-2. The bit line select transistor BS and the divided global bit line GBL of the other layers L also have a connection relationship similar to that of the layers L0 and L1.

In addition, the sense circuit 133 of the second configuration example has sense amplifiers SA whose number corresponds to the number of divisions of the global bit line GBL in each layer L. Specifically, the sense circuit 133A of the second configuration example has sense amplifiers SA0-1 and SA0-2 corresponding to the layer L0. In addition, although not shown, the sense circuit 133 of the second configuration example has sense amplifiers SA1-1 and SA1-2 corresponding to the layer L1, has sense amplifiers SA2-1 and SA2-2 corresponding to the layer L2, and has sense amplifiers SA3-1 and SA3-2 corresponding to the layer L3.

The sense amplifiers SA0-1 and SA0-2 are respectively connected to the global bit lines GBL0-1 and GBL0-2 associated with the layer L0. The sense amplifiers SA1-1 and SA1-2 are respectively connected to the global bit lines GBL1-1 and GBL1-2 associated with the layer L1 (not shown). The sense amplifiers SA2-1 and SA2-2 are respectively connected to the global bit lines GBL2-1 and GBL2-2 associated with the layer L2 (not shown). The sense amplifiers SA3-1 and SA3-2 are respectively connected to the global bit lines GBL3-1 and GBL3-2 associated with the layer L3 (not shown).

Other configurations of the subarray 111 and the sense circuits 133A and 133B of the second configuration example are the same as those of the first embodiment. In the above description, in the second configuration example, a case in which the global bit line GBL is divided into two for each layer L is described as an example, but the present disclosure is not limited thereto. The subarray 111 of the second configuration example may have global bit lines GBL divided into three or more for each layer L. In this case, the sense circuit 133 of the second configuration example has three or more sense amplifiers SA for each layer L.

3: Third Configuration Example

In the third configuration example of the memory device 100 according to the fourth embodiment, the sense circuit 133A, the subarray 111, and the sense circuit 133B are arranged side by side in the X direction as in the third embodiment. In addition, in the third configuration example, a plurality of sense amplifiers SA are assigned to each of the sense circuits 133A and 133B for each layer L.

Figure 23:
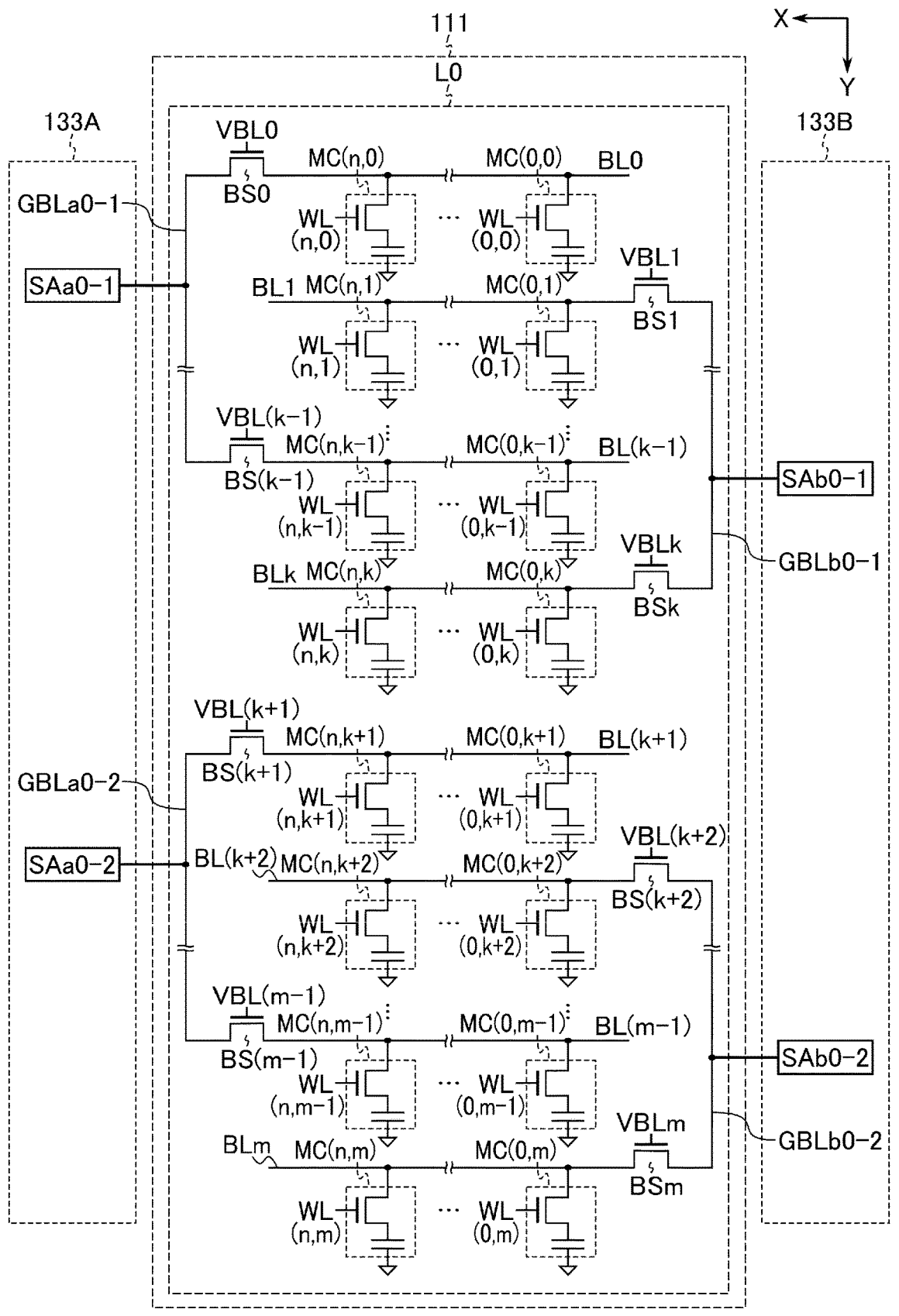
FIG. 23 is a circuit diagram showing a connection relationship between one layer in the subarray and sense circuits in a third configuration example of the memory device according to the fourth embodiment.

FIG. 23 is a circuit diagram showing a connection relationship between one layer (L0) in the subarray 111 and the sense circuits 133A and 133B in the third configuration example of the memory device 100 according to the fourth embodiment. As shown in FIG. 23, the subarray 111 of the third configuration example has a circuit configuration in which the first configuration example and the second configuration example are combined. That is, the subarray 111 of the third configuration example has a configuration in which each of the global bit lines GBLa on the sense circuit 133A side and the global bit lines GBLb on the sense circuit 133B side is divided into two or more for each layer L. In this example, the subarray 111 of the third configuration example has global bit lines GBLa0-1, GBLa0-2, GBLb0-1, and GBLb0-2 corresponding to the layer L0. In addition, although not shown, global bit lines GBLa1-1 to GBLa3-1, global bit lines GBLa1-2 to GBLa3-2, global bit lines GBLb1-1 to GBLb3-1, and global bit lines GBLb1-2 to GBLb3-2 are provided in correspondence to the layers L1 to L3.

In the layer L0, the even-numbered bit line selection transistors BS whose number is 0 or more and k or less (in the third configuration example, k is an odd number equal to or more than 1 and less than m) are connected to the correlated bit lines BL and global bit line GBLa0-1 on the sense circuit 133A side. In the layer L0, the even-numbered bit line selection transistors BS whose number is (k+1) or more and m or less are connected to the correlated bit lines BL and global bit line GBLa0-2 on the sense circuit 133A side. In the layer L0, the odd-numbered bit line selection transistors BS whose number is 0 or more and k or less are connected to the correlated bit lines BL and global bit line GBLb0-1 on the sense circuit 133B side. In the layer L0, the odd-numbered bit line selection transistors BS whose number is (k+1) or more and m or less are connected to the correlated bit lines BL and global bit line GBLb0-2 on the sense circuit 133B side.

Although not shown, in the layer L1, as in the layer L0, the even-numbered bit line select transistors BS whose number is 0 or more and k or less are connected to the correlated bit lines BL and global bit line GBLa1-1, the even-numbered bit line select transistors BS whose number is (k+1) or more and m or less are connected to the correlated bit lines BL and global bit line GBLa1-2, the odd-numbered bit line select transistors BS whose number is 0 or more and k or less are connected to the correlated bit lines BL and global bit line GBLb1-1, and the odd-numbered bit line select transistors BS whose number is (k+1) or more and m or less are connected to the correlated bit lines BL and global bit line GBLb1-2. The bit line select transistor BS and the divided global bit lines GBLa and GBLb of the other layers L also have a connection relationship similar to that of the layers L0 and L1.

In addition, the sense circuit 133A of the third configuration example has sense amplifiers SAa whose number corresponds to the number of divisions of the global bit line GBLa for each layer L. The sense circuit 133B of the third configuration example has sense amplifiers SAb whose number corresponds to the number of divisions of the global bit line GBLb for each layer L. Specifically, the sense circuit 133A of the third configuration example has sense amplifiers SAa0-1 to SAa3-1 corresponding to the global bit lines GBLa0-1 to GBLa3-1, and has sense amplifiers SAa0-2 to SAa3-2 corresponding to the global bit lines GBLa0-2 to GBLa3-2 (a part of which is not shown). The sense circuit 133B of the third configuration example has sense amplifiers SAb0-1 to SAb3-1 corresponding to the global bit lines GBLb0-1 to GBLb3-1, and has sense amplifiers SAb0-2 to SAb3-2 corresponding to the global bit lines GBLb0-2 to GBLb3-2 (a part of which is not shown).

The sense amplifiers SAa0-1, SAa0-2, SAb0-1, and SAb0-2 are respectively connected to the global bit lines GBLa0-1, GBLa0-2, GBLb0-1, and GBLb0-2 associated with the layer L0. The sense amplifiers SAa1-1, SAa1-2, SAb1-1, and SAb1-2 are respectively connected to the global bit lines GBLa1-1, GBLa1-2, GBLb1-1, and GBLb1-2 associated with the layer L1 (not shown). The sense amplifiers SAa2-1, SAa2-2, SAb2-1, and SAb2-2 are respectively connected to the global bit lines GBLa2-1, GBLa2-2, GBLb2-1, and GBLb2-2 associated with the layer L2 (not shown). The sense amplifiers SAa3-1, SAa3-2, SAb3-1, and SAb3-2 are respectively connected to the global bit lines GBLa3-1, GBLa3-2, GBLb3-1, and GBLb3-2 associated with the layer L3 (not shown).

Other configurations of the subarray 111 and the sense circuits 133A and 133B of the third configuration example are the same as those of the first embodiment. In the above description, in the third configuration example, a case in which the global bit line GBLa is connected to the even-numbered bit line select transistors BS and the global bit line GBLb is connected to the odd-numbered bit line select transistors BS is described, but the present disclosure is not limited thereto. The third configuration example need only have a configuration in which a plurality of global bit lines GBLa and GBLb are provided for each layer L, and a plurality of sense amplifiers SA correlated with the global bit lines GBLa and GBLb are assigned to the sense circuits 133A and 133B.

<4-2> Operation

Next, the operation of the memory device 100 according to the fourth embodiment will be described using a first configuration example as a representative.

Figure 24:
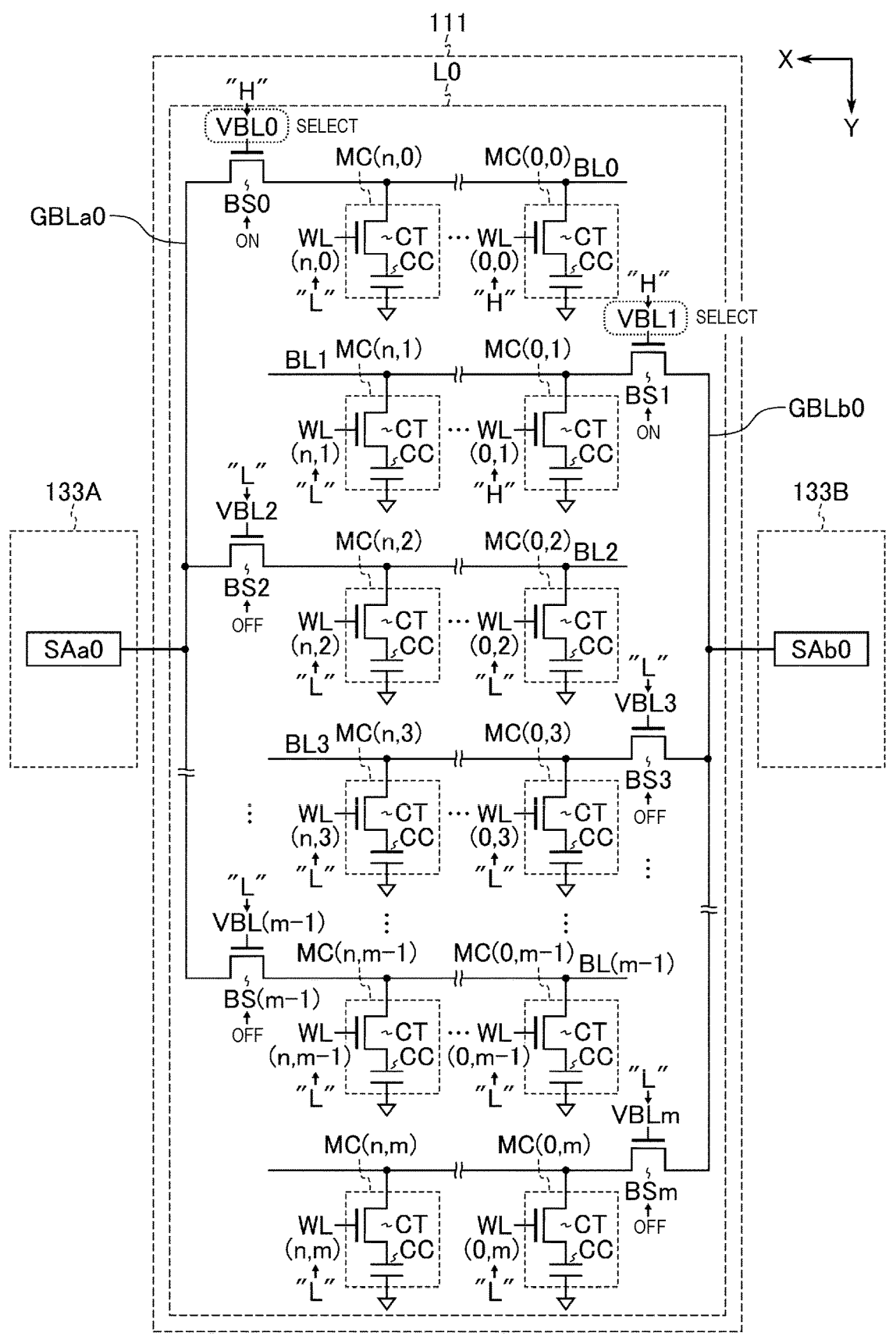
FIG. 24 is a schematic view showing a method of selecting a memory cell with focusing on one layer in the subarray in the first configuration example of the memory device according to the fourth embodiment.

FIG. 24 is a schematic view for explaining a method of selecting a memory cell MC with focusing on one layer (L0) in the subarray 111 in the first configuration example of the memory device 100 according to the fourth embodiment. A circuit configuration of the subarray 111 and the sense circuits 133A and 133B shown in FIG. 24 is the same as the circuit configuration shown in FIG. 21. As shown in FIG. 24, in the first configuration example of the memory device 100 according to the fourth embodiment, reading may be executed in parallel by the sense circuit 133A and the sense circuit 133B.

Specifically, when reading the data stored in the memory cells MC(0,0) and MC(0,1), the word lines WL(0,0) and WL(0,1) and the vertical bit line VBL0 and VBL1 are selected. That is, a voltage of an "H" level is applied to the selected wiring, and a voltage of an "L" level is applied to the non-selected wiring. As a result, in the subarray 111, each of the bit line select transistors BS0 and BS1 of each layer L is turned on, and the other bit line select transistors BS are turned off. Then, the cell transistor CT of the memory cell MC(0,0) of each layer L of the subarray 111 and the cell transistor CT of the memory cell MC(0,1) of each layer L are turned on, and the cell transistors CT of the other memory cells MC of the subarray 111 are turned off.

As a result, the sense amplifier SAa of each layer L may amplify the voltage based on the charge accumulated by the cell capacitor CC of the memory cell MC(0,0) connected via the associated global bit line GBLa on the sense circuit 133A side. Similarly, the sense amplifier SAb of each layer L may amplify the voltage based on the charge accumulated by the cell capacitor CC of the memory cell MC(0,1) connected via the associated global bit line GBLb on the sense circuit 133B side. The read/write circuit 140 may determine the data stored in the memory cell MC(0,0) of each layer L based on the voltage amplified by the sense circuit 133A, and may determine the data stored in the memory cell MC(0,1) of each layer L based on the voltage amplified by the sense circuit 133B.

In the first configuration example of the memory device 100 according to the fourth embodiment, even when a memory cell MC other than the memory cell MC(0,0) connected to the bit line BL0 is selected, the data may be read in the same manner as the memory cell MC(0,0) by changing the word line WL to be selected. In addition, in the first configuration example of the memory device 100 according to the fourth embodiment, even when a memory cell MC other than the memory cell MC(0,1) connected to the bit line BL1 is selected, the data may be read in the same manner as the memory cell MC(0,0) by changing the word line WL to be selected. In addition, in the first configuration example of the memory device 100 according to the fourth embodiment, even when the memory cell MC of the other memory units MU is selected, the data may be read in the same manner by changing the set of vertical bit lines VBL which are selected on the sense circuit 133A side and the sense circuit 133B side. The vertical bit line VBL on the sense circuit 133A side and the vertical bit line VBL on the sense circuit 133B side, which are selected in the read operation, may be adjacent to each other or may be separated from each other.

As described above, in the first configuration example of the memory device 100 of the fourth embodiment, the data may be read in parallel by the set of the sense amplifiers SAa0 to SAa3 and the set of the sense amplifiers SAb0 to SAb3. In the second configuration example and the third configuration example as well, the data may be read in parallel as in the first configuration example by selecting the plurality of wirings corresponding to the plurality of sense amplifiers SA for each layer L. That is, in the second configuration example of the memory device 100 of the fourth embodiment, the data may be read in parallel by the set of the sense amplifiers SA0-1, SA1-1, SA2-1, and SA3-1 and the set of the sense amplifiers SA0-2, SA1-2, SA2-2, and SA3-2. Similarly, in the third configuration example of the memory device 100 of the fourth embodiment, the data may be read in parallel by the set of the sense amplifiers SAa0-1, SAa1-1, SAa2-1, and SAa3-1, the set of the sense amplifiers SAa0-2, SAa1-2, SAa2-2, and SAa3-2, the set of the sense amplifiers SAb0-1, SAb1-1, SAb2-1, and SAb3-1, and the set of the sense amplifiers SAb0-2, SAb1-2, SAb2-2, and SAb3-2.

In the memory device 100 according to the fourth embodiment, the memory cell MC correlated with the sense circuit 133A and the memory cell MC correlated with the sense circuit 133B may be read simultaneously, or only one of them may be read.

<4-3> Effects of Fourth Embodiment

The memory device 100 according to the fourth embodiment can achieve the same effects as those of the first embodiment. Further, the memory device 100 according to the fourth embodiment has a configuration in which the global bit line GBL is divided for each layer L, and the sense amplifier SA is connected to each of the divided global bit lines GBL. As a result, in the memory device 100 according to the fourth embodiment, the refresh operation can be performed for each division unit of the global bit line GBL, and peak power consumption required for the control of the subarray 111 can be reduced.

<5> Fifth Embodiment

The memory device 100 according to a fifth embodiment has a configuration in which the bit line select transistors BS are connected in parallel in each of the plurality of layers L. Hereinafter, details of the memory device 100 according to the fifth embodiment will be described, mainly focusing on points different from those of the first to fourth embodiments.

<5-1> Configuration

First, a configuration of the memory device 100 according to the fifth embodiment will be described. The memory device 100 according to the fifth embodiment has a configuration in which the bit line select transistor BS is added to the first configuration example of the memory device 100 according to the fourth embodiment.

Figure 25:
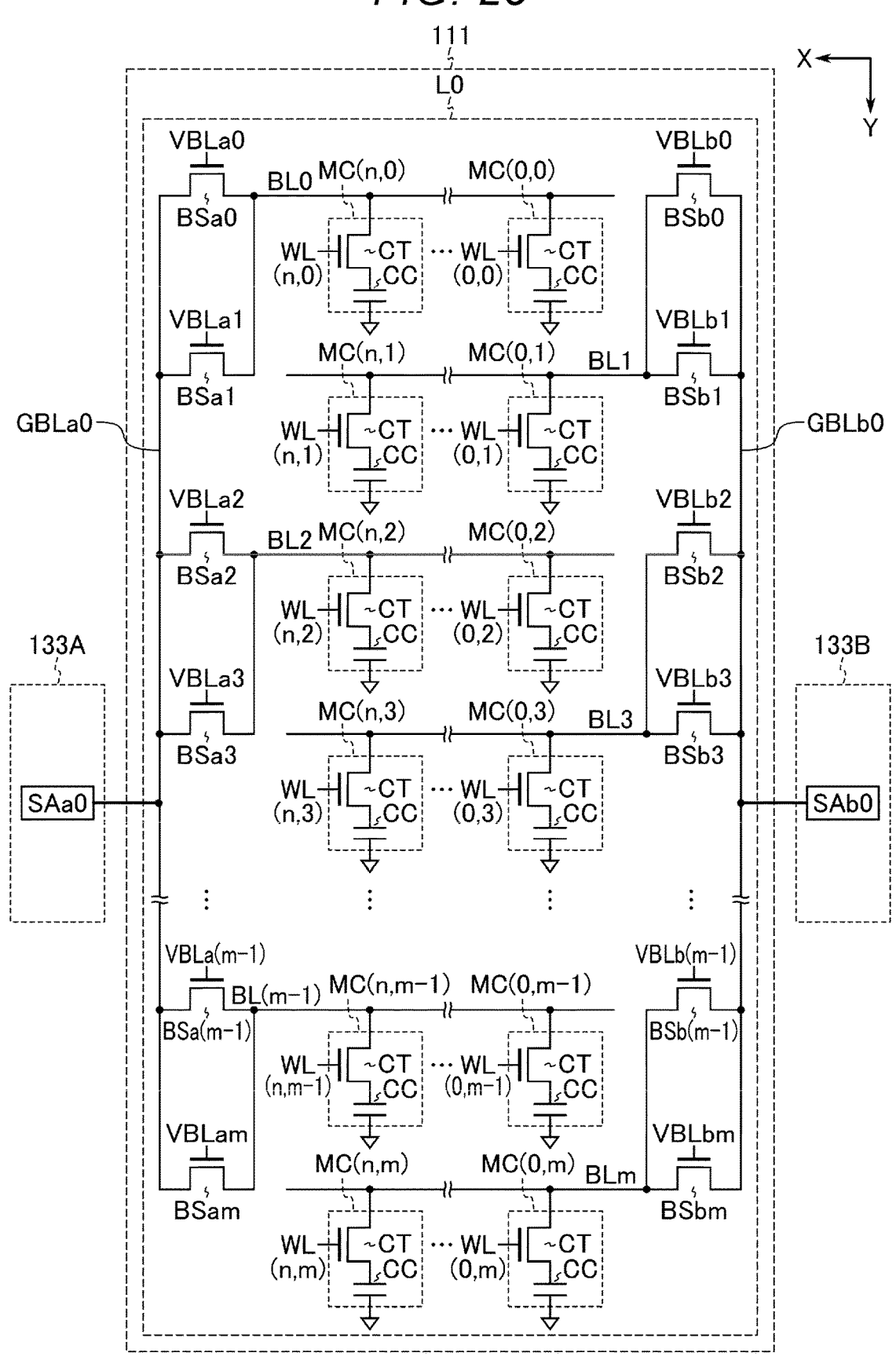
FIG. 25 is a circuit diagram showing a connection relationship between one layer in a subarray and sense circuits in a memory device according to a fifth embodiment.

FIG. 25 is a circuit diagram showing a connection relationship between one layer (L0) in the subarray 111 and the sense circuits 133A and 133B in the memory device 100 according to the fifth embodiment. As shown in FIG. 25, the subarray 111 of the fifth embodiment has global bit lines GBLa0 and GBLb0 corresponding to the layer L0. Although not shown, the subarray 111 of the fifth embodiment has global bit lines GBLa1 to GBLa3 and global bit lines GBLb1 to GBLb3 corresponding to the layers L1 to L3. The subarray 111 of the fifth embodiment has bit line select transistors BSa0 to BSam and bit line select transistors BSb0 to BSbm for each layer L.

In the layer L0, the bit line select transistors BSa(N) and BSa(N+1) (N is an even number equal to or more than 0 and equal to or less than (m−1)) are connected in parallel between the bit line BL(N) and the global bit line GBLa0 on the sense circuit 133A side. In addition, in the layer L0, the bit line select transistors BSb(N) and BSb(N+1) are connected in parallel between the bit line BL(N+1) and the global bit line GBLb0 on the sense circuit 133B side. In addition, although not shown, in the layer L1, as in the layer L0, the bit line select transistors BSa(N) and BSa(N+1) are connected in parallel between the bit line BL(N) and the global bit line GBLa1, and the bit line select transistors BSb(N) and BSb(N+1) are connected in parallel between the bit line BL(N+1) and the global bit line GBLb1. The bit line select transistors BSa and BSb and the global bit lines GBLa and GBLb of the other layers L also have a connection relationship similar to that of the layers L0 and L1.

In addition, the subarray 111 of the fifth embodiment has vertical bit lines VBLa0 to VBLam and vertical bit lines VBLb0 to VBLbm corresponding to the bit line select transistors BSa and BSb. The vertical bit lines VBLa0 to VBLam are respectively connected to the bit line select transistors BSa0 to BSam of each layer L. The vertical bit lines VBLb0 to VBLbm are respectively connected to the bit line select transistors BSb0 to BSbm of each layer L. The vertical bit lines VBLa0 to VBLam and the vertical bit lines VBLb0 to VBLbm are configured to be separately controlled.

In addition, the sense circuit 133A of the fifth configuration example has the sense amplifiers SAa whose number corresponds to the number of the layers L. The sense circuit 133B of the fifth configuration example has the sense amplifiers SAb whose number corresponds to the number of the layers L. Specifically, the sense circuit 133A of the fifth embodiment has sense amplifiers SAa0 to SAa3 corresponding to the layers L0 to L3 (a part of which is not shown). The sense circuit 133B of the fifth embodiment has sense amplifiers SAb0 to SAb3 corresponding to the layers L0 to L3 (a part of which is not shown).

The sense amplifiers SAa0 and SAb0 are respectively connected to the global bit lines GBLa0 and GBLb0 associated with the layer L0. The sense amplifiers SAa1 and SAb1 are respectively connected to the global bit lines GBLa1 and GBLb1 associated with the layer L1 (not shown). The sense amplifiers SAa2 and SAb2 are respectively connected to the global bit lines GBLa2 and GBLb2 associated with the layer L2 (not shown). The sense amplifiers SAa3 and SAb3 are respectively connected to the global bit lines GBLa3 and GBLb3 associated with the layer L3 (not shown).

As described above, in the memory device 100 according to the fifth embodiment, the plurality of bit line select transistors BS (i.e., BSa and BSb) are provided for each of the plurality of layers L, are respectively connected to the plurality of bit lines BL in the same layer L, and are connected to the global bit lines GBLa or GBLb in the same layer L. The bit line select transistors BSa(N) and BSa(N+1) or the bit line select transistors BSb(N) and BSb(N+1) are connected in parallel between any of the plurality of bit lines BL provided in the same layer L and the global bit line GBLa or GBLb. Other configurations of the subarray 111 and the sense circuits 133A and 133B of the fifth embodiment are the same as those of the first embodiment.

In the fifth embodiment, the vertical bit lines VBLa(N) and VBLa(N+1) may be short-circuited to each other because they are controlled at the same voltage. Similarly, the vertical bit lines VBLb(N) and VBLb(N+1) may be short-circuited to each other because they are controlled at the same voltage. In other words, two vertical bit lines VBL assigned to the control of two bit line select transistors BS connected to the same bit line BL may be electrically connected.

<5-2> Operation

Next, the operation of the memory device 100 according to the fifth embodiment will be described.

Figure 26:
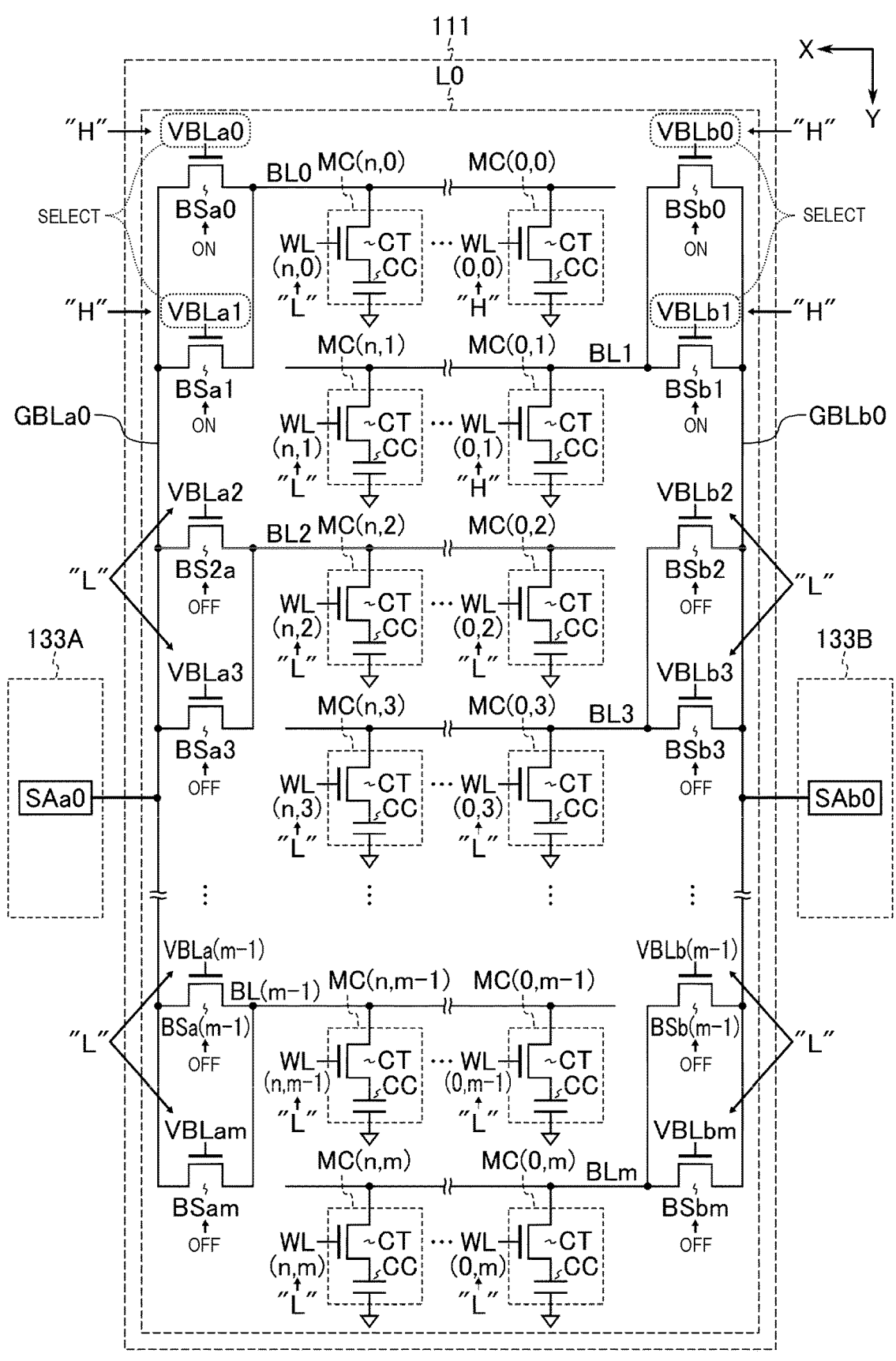
FIG. 26 is a schematic view showing a method of selecting a memory cell with focusing on one layer in the subarray of the memory device according to the fifth embodiment.

FIG. 26 is a schematic view for explaining a method of selecting a memory cell MC with focusing on one layer (L0) in the subarray 111 of the memory device 100 according to the fifth embodiment. As shown in FIG. 26, in the memory device 100 according to the fifth embodiment, reading may be executed in parallel by the sense circuit 133A and the sense circuit 133B.

In the fifth embodiment, the vertical bit line VBLa is selected for each of two vertical bit lines VBLa correlated with a set of two bit line select transistors BSa connected in parallel. Similarly, the vertical bit line VBLb is selected for each of two vertical bit lines VBLb correlated with a set of two bit line select transistors BSb connected in parallel. Specifically, when reading the data stored in the memory cells MC(0,0) and MC(0,1), the word lines WL(0,0) and WL(0,1) and the vertical bit line VBLa0, VBLa1, VBLb0, and VBLb1 are selected. A voltage of an "H" level is applied to the selected wiring, and a voltage of an "L" level is applied to the non-selected wiring. As a result, in the subarray 111, each of the bit line select transistors BSa0, BSa1, BSb0, and BSb1 of each layer L is turned on, and the other bit line select transistors BS are turned off. Then, the cell transistor CT of the memory cell MC(0,0) of each layer L and the cell transistor CT of the memory cell MC(0,1) of each layer L are turned on, and the cell transistors CT of the other memory cells MC are turned off.

As a result, the sense amplifier SAa of each layer L may amplify the voltage based on the charge accumulated by the cell capacitor CC of the memory cell MC(0,0) connected via the associated global bit line GBLa on the sense circuit 133A side. Similarly, the sense amplifier SAb of each layer L may amplify the voltage based on the charge accumulated by the cell capacitor CC of the memory cell MC(0,1) connected via the associated global bit line GBLb on the sense circuit 133B side. The read/write circuit 140 may determine the data stored in the memory cell MC(0,0) of each layer L based on the voltage amplified by the sense circuit 133A, and may determine the data stored in the memory cell MC(0,1) of each layer L based on the voltage amplified by the sense circuit 133B.

In the memory device 100 according to the fifth embodiment, even when a memory cell MC other than the memory cell MC(0,0) connected to the bit line BL0 is selected, the data may be read in the same manner as the memory cell MC(0,0) by changing the word line WL to be selected. In addition, in the memory device 100 according to the fifth embodiment, even when a memory cell MC other than the memory cell MC(0,1) connected to the bit line BL1 is selected, the data may be read in the same manner as the memory cell MC(0,1) by changing the word line WL to be selected. In addition, in the memory device 100 according to the fifth embodiment, even when the memory cell MC of the other memory units MU is selected, the data may be read in the same manner by changing the set of vertical bit lines VBL which are selected on the sense circuit 133A side and the sense circuit 133B side. The bit line BL correlated with a set of two vertical bit lines VBLa, which are selected in the read operation, and the bit line BL correlated with a set of two vertical bit lines VBLb, which are selected in the read operation, may be adjacent to each other or may be separated from each other.

<5-3> Effects of Fifth Embodiment

The memory device 100 according to the fifth embodiment can achieve the same effects as those of the first embodiment. Further, in the memory device 100 according to the fifth embodiment, the plurality of bit line select transistors BS are connected in parallel between the global bit line GBL and the bit line BL. As a result, in the memory device 100 according to the fifth embodiment, the bit line BL can be charged and discharged at a higher speed than in the first embodiment using the plurality of bit line select transistors BS connected in parallel. Accordingly, the memory device 100 according to the fifth embodiment can shorten a period of the read operation compared to the first embodiment. That is, the memory device 100 according to the fifth embodiment can operate at a higher speed than the first embodiment.

<6> Sixth Embodiment

The memory device 100 according to the sixth embodiment has a configuration in which an equalizer circuit is disposed in a region on an opposite side of the end region EA where the bit line select transistor BS is disposed with reference to the memory region MA of the subarray 111. Hereinafter, details of the memory device 100 according to the sixth embodiment will be described, mainly focusing on points different from those of the first to fifth embodiments.

<6-1> Configuration

First, a configuration of the memory device 100 according to the sixth embodiment will be described.

<6-1-1> Planar Layout of Memory Device 100

Figure 27:
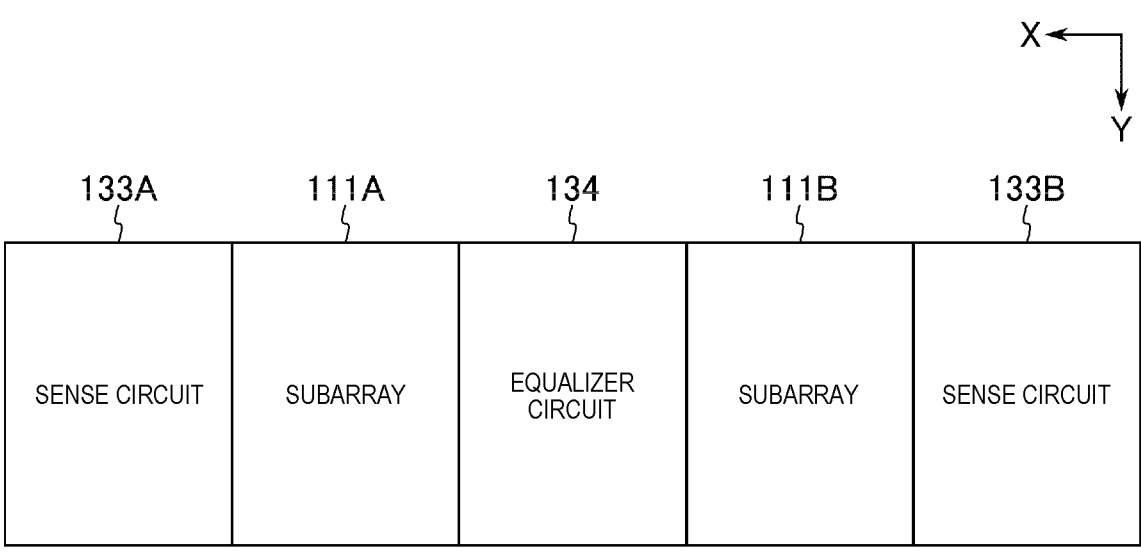
FIG. 27 is a plan view showing a planar layout of a memory device according to a sixth embodiment.

FIG. 27 is a plan view showing a planar layout of the memory device 100 according to the sixth embodiment. As shown in FIG. 27, the memory device 100 according to the sixth embodiment has subarrays 111A and 111B, sense circuits 133A and 133B, and an equalizer circuit 134. In the sixth embodiment, the subarrays 111A and 111B are disposed between the sense circuits 133A and 133B, and the equalizer circuit 134 is disposed between the subarrays 111A and 111B. In other words, the sense circuit 133A, the subarray 111A, the equalizer circuit 134, the subarray 111B, and the sense circuit 133B are arranged side by side in the X direction. In the sixth embodiment, the set of sense circuits 133A and 133B has, for example, the same configuration as the sense circuit 133 of the first embodiment. In the sixth embodiment, each of the subarrays 111A and 111B has the same configuration as the subarray 111 of the first embodiment. The equalizer circuit 134 is a circuit used for equalizing the voltages of the bit lines BL provided in the subarrays 111A and 111B.

<6-1-2> Connection Relationship Between Subarrays 111A and 111B, Sense Circuits 133A and 133B, and Equalizer Circuit 134

Figure 28:
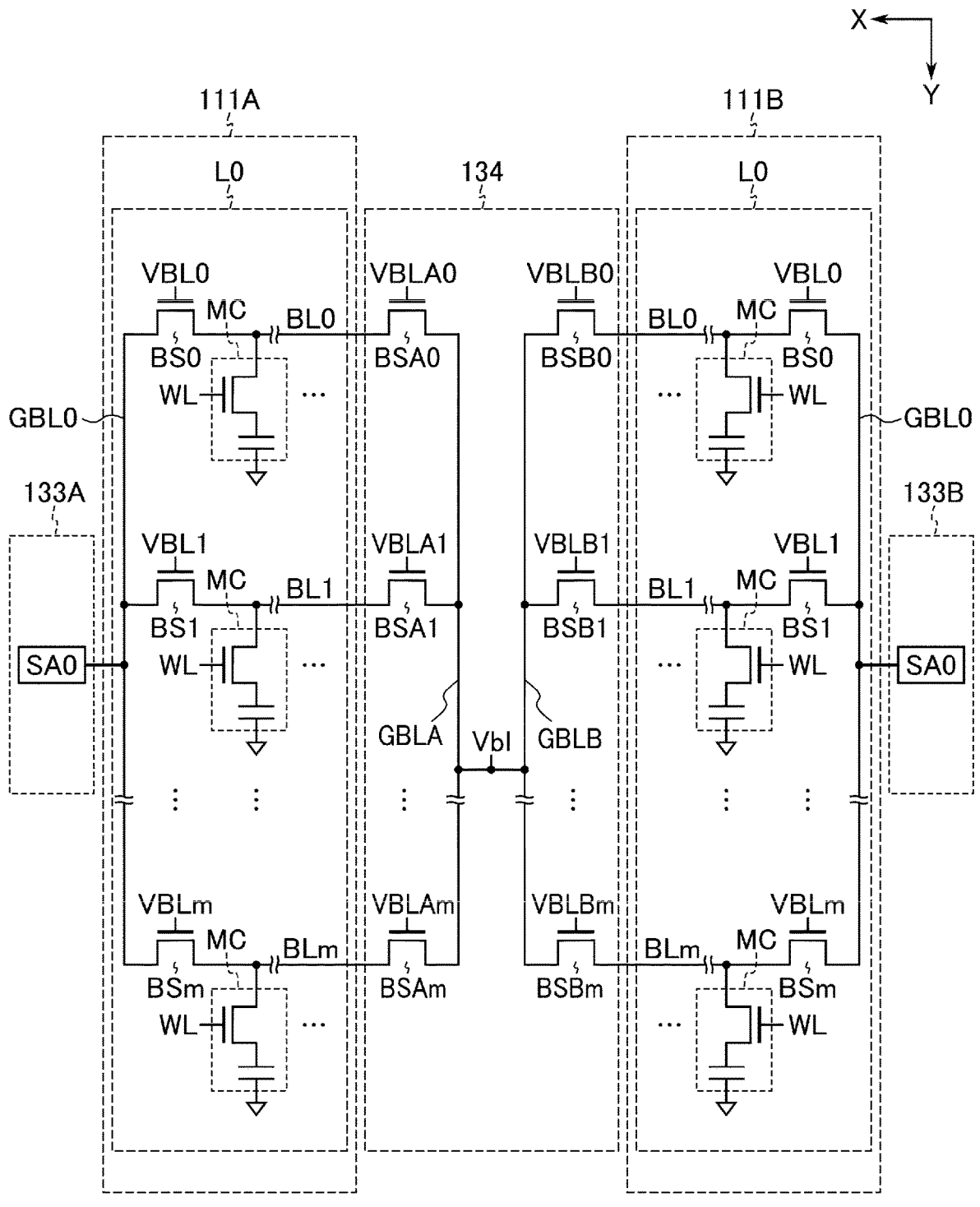
FIG. 28 is a circuit diagram showing a connection relationship between one layer in subarrays, sense circuits, and an equalizer circuit in the memory device according to the sixth embodiment.

FIG. 28 is a circuit diagram showing a connection relationship between one layer (L0) provided in the subarrays 111, the sense circuits 133A and 133B, and the equalizer circuit 134 in the memory device 100 according to the sixth embodiment. As shown in FIG. 28, the set of the subarray 111A and the sense circuit 133A of the sixth embodiment has a configuration in which the set of the subarray 111 and the sense circuit 133 of the first embodiment is inverted in the X direction. The set of the subarray 111B and the sense circuit 133B of the sixth embodiment has a configuration similar to that of the set of the subarray 111 and the sense circuit 133 of the first embodiment.

The equalizer circuit 134 has, for example, the bit line select transistors BSA0 to BSAm for each layer L of the subarray 111A and the bit line select transistors BSB0 to BSBm for each layer L of the subarray 111B (a part of which is not shown). In addition, the equalizer circuit 134 has a global bit line GBLA correlated with the subarray 111A and has a global bit line GBLB correlated with the subarray 111B.

One end of each of the bit line select transistors BSA0 to BSAm correlated with the layer L0 of the subarray 111A is connected to each of the bit lines BL0 to BLm of the layer L0 of the subarray 111A. Similarly, the bit line select transistors BSA0 to BSAm correlated with the layer L1 of the subarray 111A are connected to the bit lines BL0 to BLm of the layer L1 of the subarray 111A. The bit line select transistors BSA correlated with the other layers L also have a connection relationship similar to that of the layers L0 and L1. The other end of each of the bit line select transistors BSA0 to BSAm of each of the layers L0 to L3 of the subarray 111A is connected to the global bit line GBLA.

One end of each of the bit line select transistors BSB0 to BSBm correlated with the layer L0 of the subarray 111B is connected to each of the bit lines BL0 to BLm of the layer L0 of the subarray 111B. Similarly, the bit line select transistors BSB0 to BSBm correlated with the layer L1 of the subarray 111B are connected to the bit lines BL0 to BLm of the layer L1 of the subarray 111B. The bit line select transistors BSB correlated with the other layers L also have a connection relationship similar to that of the layers L0 and L1. The other end of each of the bit line select transistors BSB0 to BSBm of each of the layers L0 to L3 of the subarray 111B is connected to the global bit line GBLB.

In addition, the equalizer circuit 134 has vertical bit lines VBLA0 to VBLAm and vertical bit lines VBLB0 to VBLBm corresponding to the bit line select transistors BSA and BSB. The vertical bit lines VBLA0 to VBLAm are respectively connected to the bit line select transistors BSA0 to BSAm of each layer L. The vertical bit lines VBLB0 to VBLBm are respectively connected to the bit line select transistors BSB0 to BSBm of each layer L. The vertical bit lines VBLA0 to VBLAm and the vertical bit lines VBLB0 to VBLBm are configured to be separately controlled. In the equalizer circuit 134, a voltage Vb1 is applied to each of the global bit lines GBLA and GBLB. A voltage value of Vb1 may be changed by the control circuit 160. As Vb1, for example, VDD/2 is applied. VDD corresponds to a power supply voltage of the memory device 100.

<6-2> Operation

Next, the operation of the memory device 100 according to the sixth embodiment will be described. In the read operation of the memory device 100 according to the sixth embodiment, first, equalization processing using the equalizer circuit 134 is executed. Thereafter, reading using the sense circuits 133A and 133B is executed in parallel.

Figure 29:
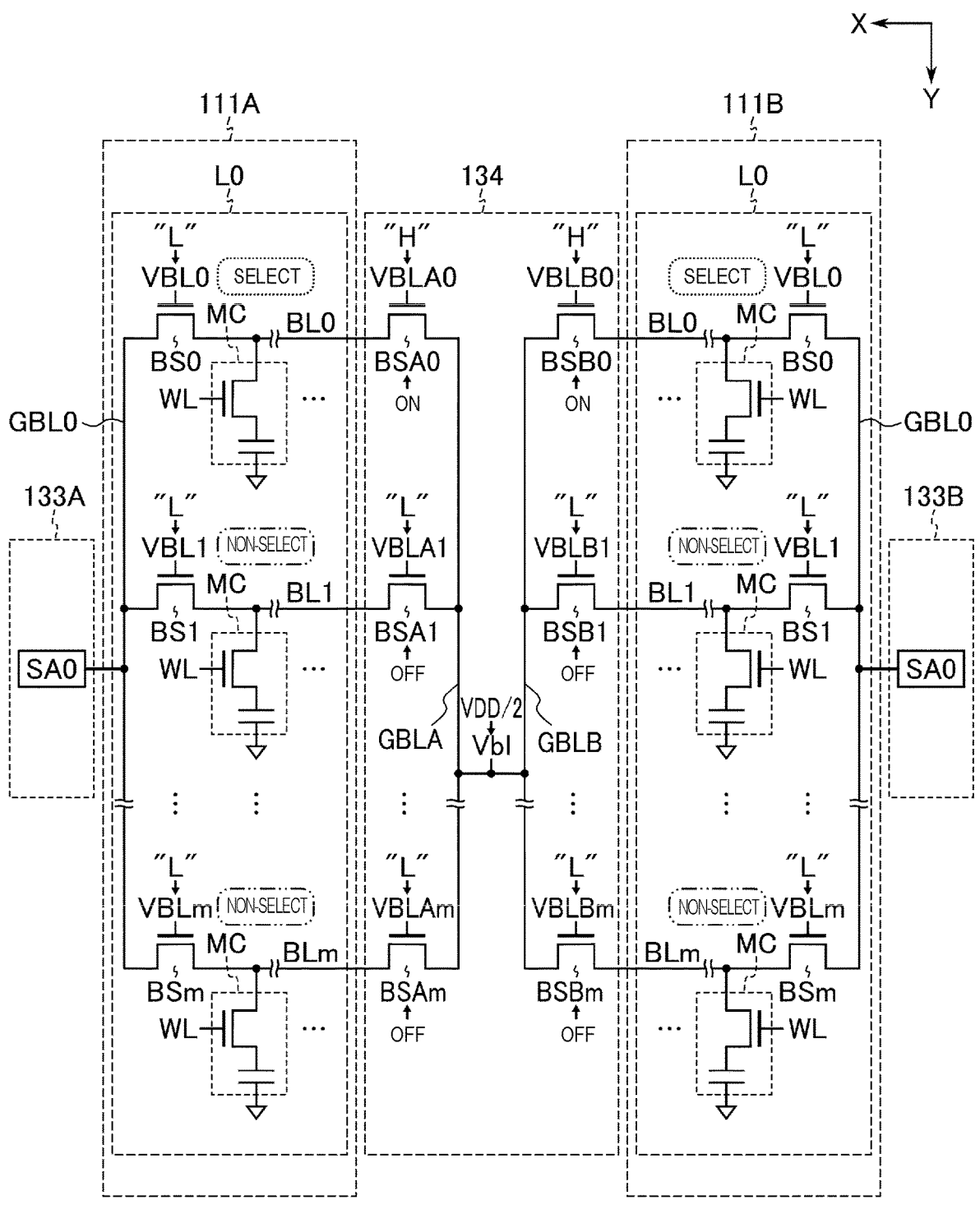
FIG. 29 is a schematic view for explaining equalization processing of a bit line with focusing on one layer in the subarrays of the memory device according to the sixth embodiment.

FIG. 29 is a schematic view for explaining equalization processing of a bit line BL with focusing on one layer (L0) in the subarrays 111A and 111B of the memory device 100 according to the sixth embodiment. As shown in FIG. 29, in the memory device 100 according to the sixth embodiment, both the bit line BL of the subarray 111A and the bit line BL of the subarray 111B may be simultaneously subjected to the equalization processing.

Specifically, first, a voltage of an "L" level is applied to each vertical bit line VBL of the subarray 111A and each vertical bit line VBL of the subarray 111B. As a result, all the bit line select transistors BS in the subarrays 111A and 111B are turned off. Then, when the data of the memory cell MC connected to the bit line BL0 of each of the subarrays 111A and 111B is read, the vertical bit lines VBLA0 and VBLB0 are selected. That is, a voltage of an "H" level is applied to the selected wiring, and a voltage of an "L" level is applied to the non-selected wiring. As a result, in the equalizer circuit 134, each of the bit line select transistors BSA0 and BSB0 of each layer L is turned on, and the other bit line select transistors BSA and BSB are turned off.

The control circuit 160 sets the voltage Vb1 to VDD/2. Then, the bit line BL0 of the subarray 111A is charged to have VDD/2 via the global bit line GBLA and the bit line select transistor BSA0. Similarly, the bit line BL0 of the subarray 111B is charged to have VDD/2 via the global bit line GBLB and the bit line select transistor BSB0. Thereafter, the selected bit line select transistors BSA and BSB are set to an off state, and the equalization processing is completed. In the equalization processing, the vertical bit lines VBLA and VBLB need only be selected such that a current path is formed between the bit line BL connected to the memory cell MC to be read and the global bit line GBLA or GBLB.

Figure 30:
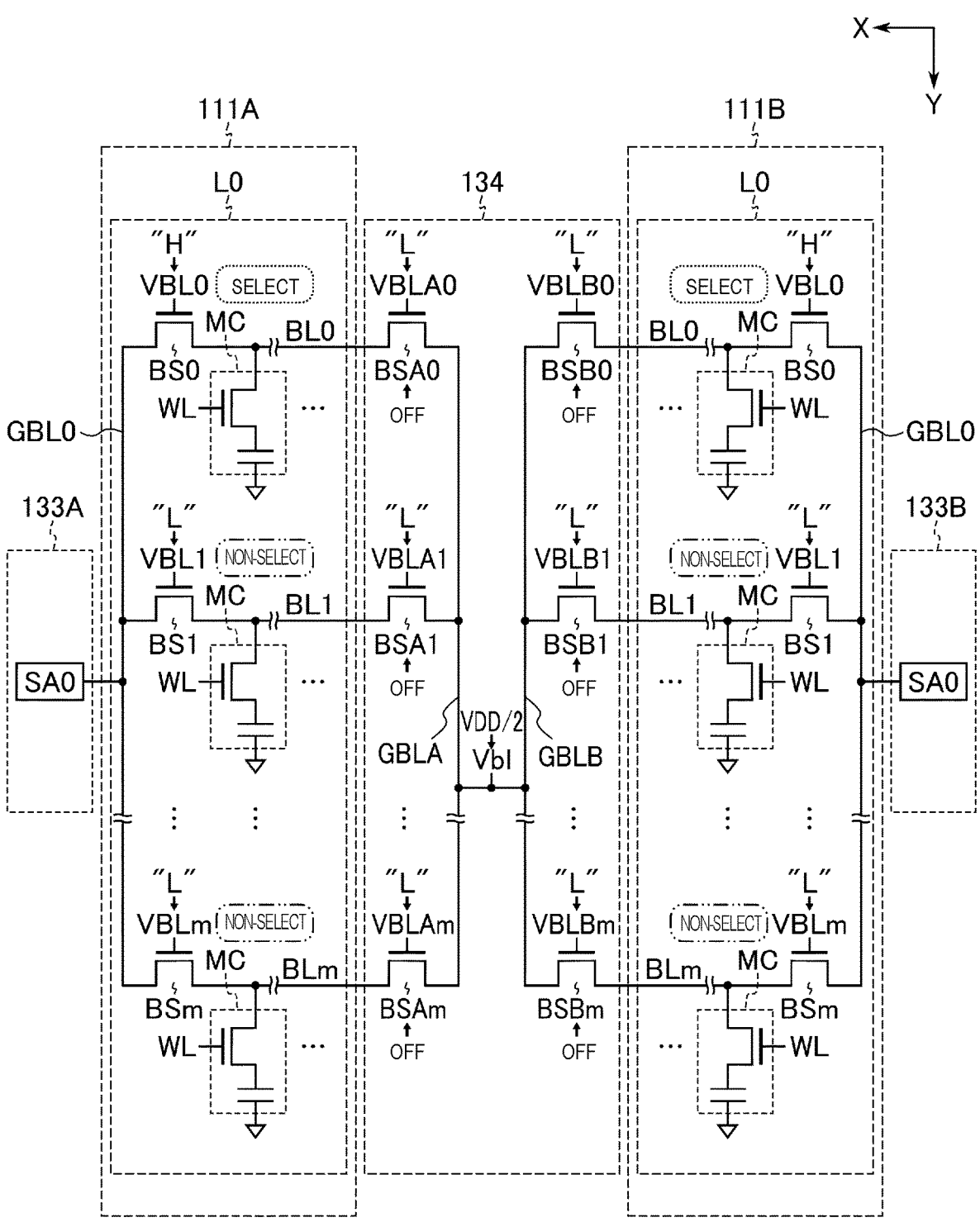
FIG. 30 is a schematic view for explaining a method of reading a memory cell with focusing on one layer in the subarrays of the memory device according to the sixth embodiment.

FIG. 30 is a schematic view for explaining a method of reading a memory cell MC with focusing on one layer (L0) in the subarrays 111A and 111B of the memory device 100 according to the sixth embodiment. FIG. 30 shows an example of the read operation that is successively executed from the state shown in FIG. 29. As shown in FIG. 30, when performing the reading, each of the bit line select transistors BSA and BSB of the equalizer circuit is set to an off state. Specifically, a voltage of an "L" level is applied to each of the vertical bit lines VBLA0 to VBLAm and the vertical bit lines VBLB0 to VBLBm. Then, in each of the set of the subarray 111A and the sense circuit 133A and the set of the subarray 111B and the sense circuit 133B, the same reading as in the first embodiment is executed. Other operations of the memory device 100 according to the sixth embodiment are the same as those of the first embodiment.

<6-3> Effects of Sixth Embodiment

The memory device 100 according to the sixth embodiment can achieve the same effects as those of the first embodiment. Further, in the subarray 111 of the memory device 100 according to the sixth embodiment, the equalizer circuit 134 is provided on a side opposite to a side on which the bit line select transistor BS is provided. The equalizer circuit 134 is shared between the subarrays 111A and 111B adjacent to each other. As a result, in the memory device 100 according to the sixth embodiment, the circuit area required for the equalizer circuit 134 can be reduced, and the chip area of the memory device 100 can be reduced. Accordingly, the memory device 100 according to the sixth embodiment can reduce the manufacturing cost.

<7> Others

The above-described embodiments may be combined to the extent possible. For example, the equalizer circuit 134 of the sixth embodiment may be combined with the second configuration example of the memory device 100 of the fourth embodiment. The second embodiment and the fourth embodiment may be combined. That is, in the second embodiment, the plurality of sense amplifiers SA may be provided for each layer L, and the global bit line GBL may be divided for each layer L.

In addition, in FIGS. 7 and 8, as the bit line select transistor BS, a structure including a gate insulating film that covers an outer peripheral portion of the vertical bit line VBL and a semiconductor layer that covers an outer peripheral portion of the gate insulating film and is connected to the global bit line GBL and any of the bit lines BL in the same layer is described as an example, but the present disclosure is not limited thereto. The bit line select transistor BS may have a structure including a semiconductor layer connected to any of the bit lines BL and the global bit line GBL, a gate insulating film that covers an outer peripheral portion of the semiconductor layer, and a vertical bit line VBL having a portion that covers an outer peripheral portion of the gate insulating film and holds a part of the semiconductor layer in the Z direction.

Figure 31:
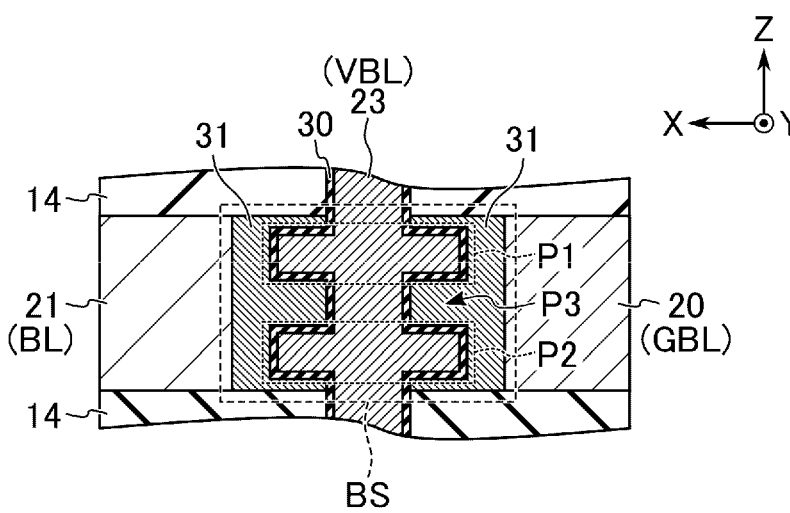
FIG. 31 is a cross-sectional view showing a cross-sectional structure of a bit line select transistor in a modification example of the first embodiment.

FIG. 31 is a cross-sectional view showing a cross-sectional structure of the bit line select transistor BS in a modification example of the first embodiment. FIG. 31 shows a configuration of one of the bit line select transistors BS and the vicinity thereof in the same cross section as in FIG. 7. As shown in FIG. 31, in the modification example of the first embodiment, the conductor layer 23 (i.e., the vertical bit line VBL) has a first portion P1, a second portion P2, and a third portion P3 for each bit line select transistor BS. In the XY cross section, a diameter of each of the first portion P1 and the second portion P2 of the conductor layer 23 is larger than a diameter of the third portion P3 of the conductor layer 23. That is, each of the first portion P1 and the second portion P2 of the conductor layer 23 corresponds to a portion protruding to the side surface in the conductor layer 23. The third portion P3 of the conductor layer 23 is provided between the first portion P1 and the second portion P2. The insulator layer 30 covers outer peripheral portions of the first portion P1, the second portion P2, and the third portion P3 of the conductor layer 23. Further, the semiconductor layer 31 covers the outer peripheral portion of the insulator layer 30 and fills a space between the first portion P1 and the second portion P2 of the conductor layer 23 in a layer at a height where the conductor layers 20 and 21 are provided. In this example, the semiconductor layer 31 need only have at least a portion interposed in the Z direction between the first portion P1 and the second portion P2 of the conductor layer 23, a portion connected to the conductor layer 20, and a portion connected to the conductor layer 21. The semiconductor layer 31 connects the conductor layers 20 and 21 correlated with each other via a space between the first portion P1 and the second portion P2 of the conductor layer 23 and a region which is not shown. That is, by applying a voltage of an "H" level to the vertical bit line VBL, a channel may be formed in the portion of the semiconductor layer 31 interposed between the first portion P1 and the second portion P2 of the conductor layer 23, and a current path may be formed between the conductor layer 20 (i.e., the global bit line GBL) and the conductor layer 21 (i.e., the bit line BL).

Similarly, in FIGS. 9 and 10, as the cell transistor CT, a structure including a gate insulating film that covers an outer peripheral portion of the word line WL and a semiconductor layer that covers an outer peripheral portion of the gate insulating film and is connected to one electrode of the cell capacitor CC and any of the bit lines BL in the same layer is described as an example, but the present disclosure is not limited thereto. The cell transistor CT may have a structure including a semiconductor layer connected to any of the bit lines BL and the one electrode of the cell capacitor CC, a gate insulating film that covers an outer peripheral portion of the semiconductor layer, and a word line WL having a portion that covers an outer peripheral portion of the gate insulating film and holds a part of the semiconductor layer in the Z direction.

Figure 32:
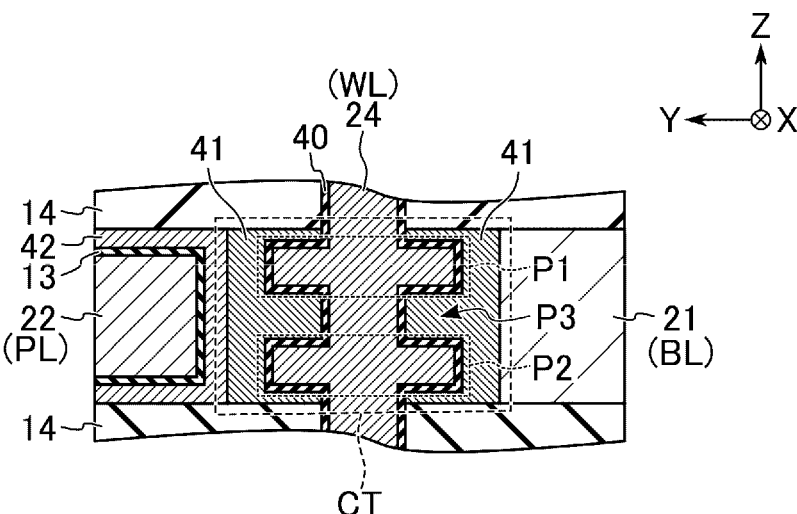
FIG. 32 is a cross-sectional view showing a cross-sectional structure of a cell transistor in the modification example of the first embodiment.

FIG. 32 is a cross-sectional view showing a cross-sectional structure of the cell transistor CT in the modification example of the first embodiment. FIG. 32 shows a configuration of one of the cell transistors CT and the vicinity thereof in the same cross section as in FIG. 9. As shown in FIG. 32, in the modification example of the first embodiment, the conductor layer 24 (i.e., the word line WL) has a first portion P1, a second portion P2, and a third portion P3 for each cell transistor CT. In the XY cross section, a diameter of each of the first portion P1 and the second portion P2 of the conductor layer 24 is larger than a diameter of the third portion P3 of the conductor layer 24. That is, each of the first portion P1 and the second portion P2 of the conductor layer 24 corresponds to a portion protruding to the side surface in the conductor layer 24. The third portion P3 of the conductor layer 24 is provided between the first portion P1 and the second portion P2. The insulator layer 40 covers outer peripheral portions of the first portion P1, the second portion P2, and the third portion P3 of the conductor layer 24. Further, the semiconductor layer 41 covers the outer peripheral portion of the insulator layer 40 and fills a space between the first portion P1 and the second portion P2 of the conductor layer 24 in a layer at a height where the conductor layers 21 and 22 are provided. In this example, the semiconductor layer 41 need only have at least a portion interposed in the Z direction between the first portion P1 and the second portion P2 of the conductor layer 24, a portion connected to the conductor layer 21, and a portion connected to the conductor layer 42. The semiconductor layer 41 connects the conductor layers 21 and 42 correlated with each other via a space between the first portion P1 and the second portion P2 of the conductor layer 24 and a region which is not shown. That is, by applying a voltage of an "H" level to the word line WL, a channel may be formed in the portion of the semiconductor layer 41 interposed between the first portion P1 and the second portion P2 of the conductor layer 24, and a current path may be formed between the conductor layer 21 (i.e., the bit line BL) and the conductor layer 42 (i.e., one electrode of cell capacitor CC).

In the drawings used in the description of the above embodiments, a case in which the contacts VC have the same diameter in the Z direction is described as an example, but the present disclosure is not limited thereto. These elements may have a tapered shape, an inverse tapered shape, or a bowing shape. Each of the word line WL and the vertical bit line VBL may have a tapered, inverse tapered, or bowing portion. In the present specification, the term "connection" indicates electrical connection, and does not exclude, for example, inclusion of another element in between. The expression "electrically connected" may be achieved via an insulator as long as an operation is performed in the same manner as when being electrically connected. The term "tapered shape" indicates a shape that is narrower as it is separated from a reference substrate. The term "inverse tapered shape" indicates a shape that is thicker as it is separated from a reference substrate. The "outer diameter" is calculated, for example, by an average of the major axis and the minor axis when the target component has an elliptical shape. The "region" may be regarded as an element of the semiconductor substrate SUB. In addition, each configuration used in the description of the planar layout may be treated as a "region". The term "semiconductor layer" may be referred to as a "conductor layer". The "top view" corresponds to viewing the front surface side of the semiconductor substrate SUB from above. The "odd number" and the "even number" are specified, for example, according to the order from which the reference component is set.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A memory device, comprising:
a plurality of memory cells provided for each of a plurality of layers arranged in a first direction, the memory cells of each of the layers including a plurality of groups of memory cells, the memory cells of each of the groups being arranged in a second direction intersecting the first direction, the groups being arranged in a third direction intersecting the first and second directions;
a plurality of first wirings arranged in the third direction in each of the layers and respectively connected to the groups of memory cells in each of the layers;
a plurality of first transistors each connected to a corresponding one of the first wirings;
a plurality of second wirings each connected to the first transistors of a corresponding one of the layers;
a plurality of third wirings each extending in the first direction and connected to one of the memory cells in each of the layers; and
a plurality of fourth wirings each extending in the first direction and connected to a gate of a corresponding one of the first transistors in each of the layers, wherein
each of the memory cells includes:
a second transistor having one end connected to the corresponding first wiring and a gate connected to the corresponding third wiring, and
a capacitor having one electrode connected to another end of the second transistor.
2. The memory device according to claim 1, further comprising:
a plurality of sense amplifiers each connected to a corresponding one of the second wirings.
3. The memory device according to claim 2, further comprising:
an equalizer circuit connected to the first wirings of each of the layers, wherein
the sense amplifiers are in a first region,
the equalizer circuit is in a second region, and
the memory cells are in a third region between the first and second regions.
4. The memory device according to claim 1, wherein the second transistor includes:
a first semiconductor layer that faces the corresponding third wiring and is connected to the corresponding first wiring and said one electrode of the capacitor, and
a first insulator layer between the corresponding third wiring and the first semiconductor layer.
5. The memory device according to claim 4, wherein each of the first transistors includes:
a second semiconductor layer that faces the corresponding fourth wiring and is connected to the corresponding first and second wirings, and
a second insulator layer between the corresponding fourth wiring and the second semiconductor layer.
6. The memory device according to claim 1, further comprising:
a plurality of contacts each extending in the first direction and connected to a terrace portion of a corresponding one of the second wirings, wherein
the terrace portion of one of the second wirings does not overlap any other second wirings disposed above in the first direction.
7. The memory device according to claim 1, further comprising:
a plurality of sense amplifiers each connected to a corresponding one of the second wirings, wherein
the sense amplifiers include a plurality of first sense amplifiers in a first region and a plurality of second sense amplifiers in a second region, and
the memory cells are between the first and second regions.

35

8. A memory device, comprising:

a plurality of memory cells provided for each of a plurality of layers arranged in a first direction, the memory cells of each of the layers including a plurality of groups of memory cells, the memory cells of each of the groups being arranged in a second direction intersecting the first direction, the groups being arranged in a third direction intersecting the first and second directions;

a plurality of first wirings arranged in the third direction in each of the layers and respectively connected to the groups of memory cells in each of the layers;

a plurality of first transistors each connected to a corresponding one of the first wirings;

a plurality of second wirings each connected to the first transistors of a corresponding one of the layers;

a plurality of third wirings each extending in the first direction and connected to one of the memory cells in each of the layers;

a plurality of fourth wirings each extending in the first direction and connected to a gate of a corresponding one of the first transistors in each of the layers; and a plurality of sense amplifiers each connected to a corresponding one of the second wirings, wherein the sense amplifiers include a plurality of first sense amplifiers in a first region and a plurality of second sense amplifiers in a second region, the memory cells are between the first and second regions, and each of the first sense amplifiers is connected to the corresponding second wiring of an odd-numbered layer among the layers, and each of the second sense amplifiers is connected to the corresponding second wiring of an even-numbered layer among the layers.

9. The memory device according to claim 8, wherein a conductor layer is not between two second wirings of two odd-numbered layers adjacent to each other and between two second wirings of two even-numbered layers adjacent to each other.

10. A memory device, comprising:

a plurality of memory cells provided for each of a plurality of layers arranged in a first direction, the memory cells of each of the layers including a plurality of groups of memory cells, the memory cells of each of the groups being arranged in a second direction intersecting the first direction, the groups being arranged in a third direction intersecting the first and second directions;

a plurality of first wirings arranged in the third direction in each of the layers and respectively connected to the groups of memory cells in each of the layers;

a plurality of first transistors each connected to a corresponding one of the first wirings;

a plurality of second wirings each connected to the first transistors of a corresponding one of the layers;

a plurality of third wirings each extending in the first direction and connected to one of the memory cells in each of the layers;

a plurality of fourth wirings each extending in the first direction and connected to a gate of a corresponding one of the first transistors in each of the layers;

a plurality of first sense amplifiers; and a plurality of second sense amplifiers, wherein each of the second wirings includes fifth and sixth wirings separated from each other, and each of the first sense amplifiers is connected to the fifth wiring of one of the second wirings, and each of the second sense amplifiers is connected to the sixth wiring of said one of the second wirings.

11. The memory device according to claim 10, wherein the first sense amplifiers are in a first region, the second sense amplifiers are in a second region, and the memory cells are in a third region between the first and second regions.

12. The memory device according to claim 11, wherein the fifth wiring is connected to the first transistors connected to even-numbered first wirings, and the sixth wiring is connected to the first transistors connected to odd-numbered first wirings.

13. The memory device according to claim 12, further comprising:

a plurality of third transistors each connected to a corresponding one of the first wirings and the second wiring in each of the layers, wherein the first and third transistors are connected in parallel.

14. The memory device according to claim 10, wherein the first and second sense amplifiers are in a first region, and the memory cells are in a second region adjacent to the first region.

* * * * *